United States Patent
He et al.

(10) Patent No.: US 11,240,931 B1
(45) Date of Patent: Feb. 1, 2022

(54) VARIABLE HEIGHT FAN

(71) Applicant: Dell Products, LP, Round Rock, TX (US)

(72) Inventors: Qinghong He, Austin, TX (US); Jay M. Zill, Round Rock, TX (US); Ken Nicholas, Leander, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/931,027

(22) Filed: Jul. 16, 2020

(51) Int. Cl.
*H05K 7/20* (2006.01)

(52) U.S. Cl.
CPC ............... *H05K 7/20172* (2013.01)

(58) Field of Classification Search
CPC ............ H05K 7/20172; H05K 7/20209
USPC ........................................... 361/688
See application file for complete search history.

(56) References Cited

U.S. PATENT DOCUMENTS

| | | | |
|---|---|---|---|
| 1,921,218 A * | 8/1933 | Colby ................ | F04D 25/0613 417/354 |
| 2,330,938 A | 10/1943 | Williams | |
| 2,430,225 A * | 11/1947 | Hagler ................ | F24F 7/007 417/423.15 |
| 3,431,978 A * | 3/1969 | Papst ................ | F04D 29/281 416/213 R |
| 3,592,260 A | 7/1971 | Berger | |
| 3,597,117 A * | 8/1971 | Zoehfeld ............ | F04D 17/16 417/354 |
| 3,950,112 A | 4/1976 | Crump | |
| 4,917,572 A * | 4/1990 | Van Houten ........ | F04D 17/16 415/121.2 |
| 5,601,412 A * | 2/1997 | Vice ................... | F04D 29/703 416/2 |
| 6,021,042 A | 2/2000 | Anderson | |
| 6,328,097 B1 | 12/2001 | Bookhardt | |
| 6,351,380 B1 * | 2/2002 | Curlee ................ | F16B 5/065 165/80.3 |
| 6,373,700 B1 | 4/2002 | Wang | |
| 6,525,936 B2 | 2/2003 | Beitelmal | |
| 6,567,269 B2 | 5/2003 | Homer | |
| 6,652,223 B1 | 11/2003 | Horng | |
| 6,789,999 B2 | 9/2004 | Bikos | |
| 6,989,988 B2 | 1/2006 | Arbogast | |
| 7,071,587 B2 | 7/2006 | Lopatinsky | |
| 7,079,388 B2 | 7/2006 | Faneuf | |
| 7,079,394 B2 | 7/2006 | Mok | |
| 7,215,543 B2 | 5/2007 | Arbogast | |
| 7,245,490 B2 * | 7/2007 | Chou ................ | F04D 29/601 361/694 |

(Continued)

*Primary Examiner* — Anatoly Vortman
(74) *Attorney, Agent, or Firm* — Prol Intellectual Property Law, PLLC; H. Kenneth Prol

(57) ABSTRACT

An information handling system may include a processor, a memory, and a power source; a base chassis including an outer cover surface; a variable height fan including: a main shaft including a cavity formed centrally within the main shaft; a first set of fan blades operatively coupled to the main shaft; a slide shaft placed within the cavity of the main shaft where the slide shaft is operatively coupled to the main shaft to rotate with the main shaft; a second set of fan blades operatively coupled to the slide shaft; a biasing member to bias the slide shaft to extend out of the main shaft; and a contact point prominence as a rotational point interface with the slide shaft operatively coupled to the outer cover surface.

20 Claims, 9 Drawing Sheets

(56) References Cited

U.S. PATENT DOCUMENTS

| | | | |
|---|---|---|---|
| 7,359,196 B2* | 4/2008 | Foster, Sr. | H01L 23/467 |
| | | | 165/104.34 |
| 7,623,344 B2* | 11/2009 | Beall | G06F 1/183 |
| | | | 361/679.48 |
| 8,029,237 B2* | 10/2011 | Chang | F04D 29/281 |
| | | | 415/206 |
| 8,104,295 B2 | 1/2012 | Lofy | |
| 8,142,147 B2 | 3/2012 | O'Connor | |
| 8,157,540 B2* | 4/2012 | Aoki | F04D 25/082 |
| | | | 417/354 |
| 9,845,805 B2 | 12/2017 | Bhutan | |
| 10,485,135 B2 | 11/2019 | He | |
| 10,539,150 B2 | 1/2020 | Ling | |
| 10,584,717 B1 | 3/2020 | He | |
| 10,687,440 B1 | 6/2020 | He | |
| 2002/0119044 A1* | 8/2002 | O'Connor, Jr. | F04D 29/4246 |
| | | | 415/204 |
| 2002/0172008 A1 | 11/2002 | Michael | |
| 2003/0161102 A1 | 8/2003 | Lee | |
| 2003/0220721 A1 | 11/2003 | Cohen | |
| 2004/0099404 A1 | 5/2004 | Cipolla | |
| 2006/0078428 A1 | 4/2006 | Zheng | |
| 2006/0193113 A1 | 8/2006 | Cohen | |
| 2006/0263210 A1 | 11/2006 | Wang | |
| 2007/0160462 A1 | 7/2007 | Tsang | |
| 2007/0227699 A1 | 10/2007 | Nishi | |
| 2007/0268668 A1 | 11/2007 | Lin | |
| 2008/0035315 A1 | 2/2008 | Han | |
| 2008/0229758 A1 | 9/2008 | Lin | |
| 2009/0266518 A1 | 10/2009 | Huang | |
| 2009/0324403 A1 | 12/2009 | Zheng | |
| 2010/0071875 A1 | 3/2010 | Hwang | |
| 2011/0097195 A1 | 4/2011 | Horng | |
| 2011/0110774 A1 | 5/2011 | Horng | |
| 2011/0203295 A1 | 8/2011 | Hsu | |
| 2011/0251733 A1 | 10/2011 | Atkinson | |
| 2011/0272120 A1 | 11/2011 | Joshi | |
| 2013/0011255 A1 | 1/2013 | Horng | |
| 2013/0243628 A1 | 9/2013 | Zheng | |
| 2014/0063726 A1 | 3/2014 | Liu | |
| 2014/0092556 A1 | 4/2014 | Turney | |
| 2014/0185240 A1 | 7/2014 | Macdonald | |
| 2015/0003974 A1 | 1/2015 | Heymann | |
| 2015/0116928 A1 | 4/2015 | Delano | |
| 2016/0003261 A1 | 1/2016 | Tamaoka | |
| 2016/0037683 A1 | 2/2016 | Tamaoka | |
| 2016/0369811 A1 | 12/2016 | Ling | |
| 2017/0359920 A1 | 12/2017 | Huang | |
| 2019/0008073 A1 | 1/2019 | He | |
| 2019/0184868 A1 | 6/2019 | Kim | |
| 2020/0027808 A1 | 1/2020 | Subrahmanyam | |

* cited by examiner

VARIABLE HEIGHT FAN

FIELD OF THE DISCLOSURE

The present disclosure generally relates to a thermal control system for an information handling system. The present disclosure more specifically relates to a variable height fan used, in some examples, in an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Several components of an information handling system may generate heat which may require cooling systems to mitigate. Further, the information handling system may include a fan used to cool the components within the information handling system such as a processing device and power systems, among others.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
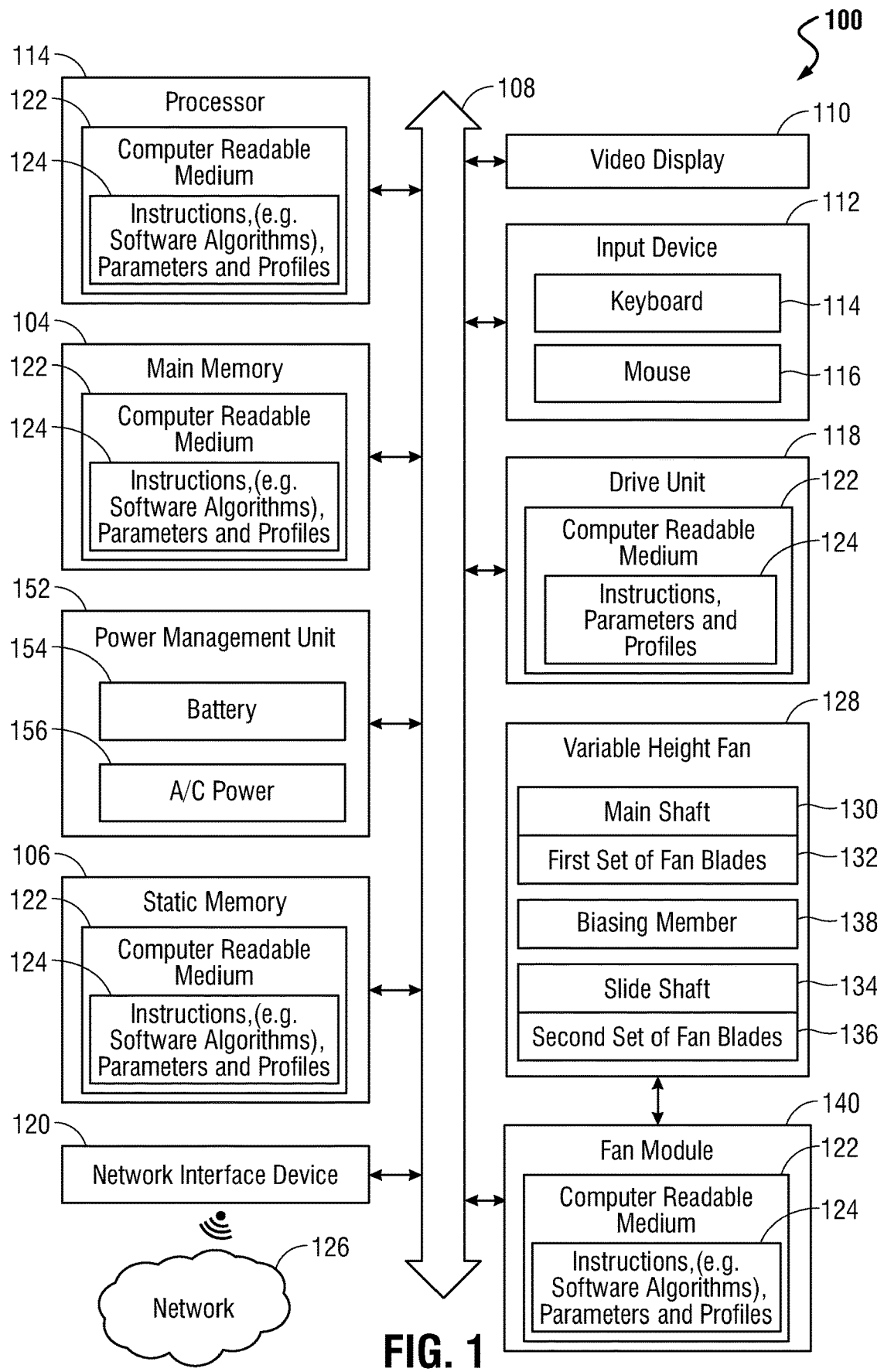
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for an information handling system that includes a processor and a memory along with a variable height fan used as part of a thermal regulation system to cool the processor and other components of the information handling system. The variable height fan may be a blower fan system with one or more air inlets and one or more air outlet apertures to direct airflow inside an information handling system chassis to move airflow within the chassis in some example embodiments. The variable height fan may include a fan housing in some embodiments that may be of any form to direct inlet and outlet airflow as desired within an information handling system chassis and to work with any number of cooling system structures and systems. In some embodiments, any portion of the D-cover, C-cover, keyboard chassis support, or other part of the information handling system chassis my support the variable height fan and serve as a fan housing in whole or in part in embodiments herein v The variable height fan may include a main shaft including a cavity formed centrally within the main shaft; a first set of fan blades mechanically coupled to the main shaft; a slide shaft placed within the cavity of the main shaft; the slide shaft being mechanically coupled to the main shaft to rotate with the main shaft; a second set of fan blades mechanically coupled to the slide shaft; and a biasing member to bias the slide shaft to extend out of the main shaft. In some embodiments, the second set of fan blades are placed to fit between the first set of fan blades such that every other fan blade of the variable height fan forms a blade of the same set of fan blades. In some embodiments, the second set of fan blades are slidably coupled to the first set of fan blades. In order to cause the first set of fan blades to rotate with the second set of fan blades, in an embodiment, the slide shaft may further include a spline that mates with a groove formed within the cavity formed in the main shaft.

In some embodiments, the variable height fan may include a contact point that interfaces mechanically with the slide shaft to allow the slide shaft to slide into the cavity. The contact point may convert force applied against a D-cover adjacent to the variable height fan to the translation of the first set of fan blades relative to the second set of fan blades such that the height of the fan blades is selectively reduced.

The arrangements of the variable height fan described herein allows for a maximum height of fan placed within the information handling system even when the overall thickness of the information handling system (e.g., thickness of a keyboard chassis) is being reduced such as by pressing down on a chassis based housing for example. Such forces on the base chassis may to reduce the overall thickness of the information handling system. As the thickness of the information handling system is being reduced, the space within the information handling system used to house the fan is also reduced. In some example embodiments, the thickness of the fan itself is thus reduced to fit within the smaller areas created when the base chassis is subjected to compression forces in the information handling systems.

Previous systems required a narrower fan to accommodate flex of the base chassis due to compressive forces. This may reduce the ability of the fan to cool the elements within the information handling system such as the processor. The thickness of the fan is further reduced relative to the thickness of the information handling system in order to provide for a fan gap between the blades of the fan and a D-cover used to house the fan and other components of the information handling system. This fan gap may be as wide as 1 mm to 2 mm which reduces the height of the fan so that the fan is to be kept away from the D-cover. The fan is kept away from the D-cover so as to avoid damage to the fan if and when the D-cover is deflected into the fan and the fan blades. Because the thickness of the information handling system may be as small as 15 mm to 25 mm (or wider) with a fan height of between 4.5 mm to 8 mm, a reduction in height of 1 mm to 2 mm to accommodate a fan gap may be a significant reduction in usable space within the information handling system. Accordingly, the translatable second set of fan blades that can be translated towards or away from the first set of fan blades, according to embodiments of the present disclosure, reduces or eliminates the fan gap. As a result, the thickness of the information handling system may be reduced without sacrificing fan height or fan performance in embodiments herein.

In addition to providing better use of space within the information handling system, the variable height fan described herein may increase the amount of cooling provided to the components of the information handling system relative to a static, reduced height fan. In an embodiment, the use of a first set of blades and a second set of blades may maximize the amount of air passed through the variable height fan and the information handling system. This may increase the ability of the variable height fan to cool the components of the information handling system while also decreasing the height of the variable height fan as the chassis is subject to various external forces.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a specific embodiment, the information handling system 100 is described herein as being a notebook-type, laptop computing device. These types of information handling systems 100 may include a series of chassis (e.g., a metal chassis) used to encase the components of the information handling system 100. For example, the chassis may include an A-cover functioning to enclose a portion of the information handling system 100. In this embodiment, the chassis may further include a B-cover functioning to enclose a video or digital display device. Here, the A-cover and the B-cover may be joined together in an embodiment to form a fully enclosed display chassis of the laptop-type information handling system 100. In this embodiment, the chassis may further include a C-cover housing a keyboard, touchpad, and any cover in which these components are set. The chassis may also include a D cover base housing for the laptop-type information handling system 100. In some embodiments, the C-cover and D-cover may operate to enclose or house a second display screen or support a large foldable display screen with the display having a second display screen or support a large foldable display screen with the display housing A-cover and B-cover. These systems may be a dual-screen or foldable screen laptop-type information handling system 100 in some embodiments. The C cover and the D cover may be joined together to form a fully enclosed base chassis. The chassis in some embodiments described herein may be coupled together via a hinge operably connecting the display chassis (e.g., the A-cover and D-cover assembly) with the base chassis (e.g., C-cover and the D-cover assembly) so as to place the base chassis of the laptop-type information handling system 100 in a plurality of configurations with respect to the digital display enclosed within the display chassis.

Because of the transportability of these laptop-type information handling systems 100, the weight and certain dimensions of these information handling systems 100 are to be reduced to make handling easier by the user. The weight of size of the information handling system 100 may be reduced by making the display chassis and, more specifically, the base chassis thinner. The base chassis may be a location within the information handling system 100 where the fan is placed. However, by making the base chassis thinner, the ability of a fan to cool and maintain temperatures within the base chassis is reduced due to the reduced size of the fan that can be placed within the thinner base chassis. Indeed, the height of the fan may be further reduced so that movement of the C-cover or D-cover into the fan does not cause the interior surface of the C-cover or D-cover to mechanically interface with the blades of the fan causing damage. The space between the fan and the C-cover or D-cover, often called the air gap, may be sufficient such that bending of the D-cover into the interior of the base chassis at the location of the fan does not cause the interior of the D-cover to come in contact with the blades of the fan. This air gap further reduces the size of the fan that can be used, thereby reducing the ability of the fan to maintain appropriate temperatures within the base chassis of the information handling system 100. Thus, a variable height fan 128 is utilized to fill the height of the base chassis and adjust its height with the flexing or bending of the C-cover or D-cover of the base chassis.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices, such as a keyboard, a mouse, a video/graphic display, or any combination thereof. The information handling system 100 can also include one or more buses operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 associated with the main memory 104, static memory 106 and processor 102, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse 116, touchpad, or gesture or touch screen input, and a keyboard 114). The information handling system 100 can also include a disk drive unit 116.

The network interface device 120 may provide connectivity to a network 128, e.g., a wide area network (WAN), a local area network (LAN), wireless local area network (WLAN), a wireless personal area network (WPAN), a wireless wide area network (WWAN), or other networks. Connectivity may be via wired or wireless connection. The network interface device 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links. The network interface device 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN standards, which may operate in both licensed and unlicensed spectrums.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer-based functions disclosed herein. For example, instructions 124 may execute a fan module 140, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 may also contain space for data storage. Further, the instructions 124 may embody one or more of the methods or logic as described herein. For example, instructions relating to the fan module 140 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the fan module 140 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The fan module 140 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may further include a power management unit (PMU) 152. The PMU 152 may manage the power provided to the components of the information handling system 100 such as the processor 102, the fan module 140, the variable height fan 128, and the video display 110. In an embodiment, the PMU 152 may be electrically coupled to a printed circuit board associated with the variable height fan 128 to provide power to, for example, an electromagnet or other driving mechanism for the variable height fan 128. The PMU 152 may also be coupled to the bus 108 of the information handling system 100 to provide power to the various components of the information handling system 100 described herein. In an embodiment, the amount of power provided to the variable height fan 128 to operate may be sufficient to rotate the first set of fan blades 132 and second set of fan blades 136 as described herein. The PMU 152 may include regulating power from a power source such as a battery 154 and A/C power 156. In an embodiment, the battery 154 may be charged via the A/C power source 156 and provide power the to the components of the information handling system 100 when A/C power 156 is removed.

As described, the information handling system 100 may include a fan module 140 that may be operably connected to the bus 108. The fan module 140 may include a controller or other processing logic and may be coupled to the PMU 152 for drawing power to the variable height fan 128. The computer readable medium 122 associated with the fan module 140 may also contain space for data storage. The fan module 140 may, according to the present description, perform tasks related to operating the variable height fan 128. In some embodiments, the fan module 140 may, upon execution of the processor 102, cause signals to be sent to the variable height fan 128 to operate the fan during when certain circumstances are met. By way of example, the fan module 140 may cause the variable height fan 128 and specifically the main shaft 130 and slide shaft 134 to turn when the processor 102 has received a signal descriptive of a high temperature within the information handling system 100. The temperature may be detected via, for example, a temperature sensor (not shown) within the information handling system 100. In another embodiment, the fan module 140 may send the signals to the variable height fan 128 to operate based on a threshold number of processes being executed by the processor 102. Because the variable height fan 128 is meant to cool down certain elements within the information handling system 100 and specifically the processor 102, the number of processes executed by the processor 102 may be indicative of an anticipated rise in temperature within the information handling system 100. Other methods may be implemented by the processor 102 and fan module 140 that cause the fan module 140 to direct the operation of the variable height fan 128 and the present specification contemplates the use of these other methods.

In an embodiment, the variable height fan 128 may be associated with other cooling devices that may be included within the information handling system 100. In an embodiment the information handling system 100 may include additional cooling systems such as heat pipes, heat sinks, vapor chambers, liquid cooling systems, and similar temperature regulation systems. In the example where heat sinks, heat pipes, and vapor chambers are used, the variable height fan 128 may be used to pass air into the base chassis housing these additional cooling devices to pass an airflow over the heat pipes, heat sinks, and vapor chambers to direct heat away from the components of the information handling system 100 and out of the base chassis. Heated air may also leave the information handling system chassis via exhaust vents situated on the sides, back, C-cover, D-cover, or anywhere in the chassis or system housing.

In an embodiment, the fan module 140 may communicate with one or more fan devices, the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Driver software, firmware, controllers and the like may communicate with applications on the information handling system 100.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The information handling system 100 further includes the variable height fan 128 operatively coupled to the fan module 140 as described herein. The variable height fan 128 is formed to be capable of dynamically changing its thickness as a force is placed against a C-cover or D-cover of the information handling system 100 that is formed below or above the variable height fan 128. When the force is applied to the C-cover or D-cover of the information handling system 100, the C-cover or D-cover may be deformed such that the C-cover or D-cover interacts with the variable height fan 128. In an embodiment, the variable height fan 128 may be mounted over a D-cover intake vent. In another embodiment, the variable height fan 128 may be mounted below a C-cover intake vent. In either embodiment, the variable height fan 128 may intake air through the D-cover intake vent or C-cover intake vent, pass air throughout the information handling system 100, and out of a heat exhaust vent.

In order to prevent the deformation of the D-cover from contacting the first set of blades 132 of the main shaft 130 and second set of fan blades 136 of the slide shaft 134, the variable height fan 128 is made to be collapsible. That is, the variable height fan 128 may include the slide shaft 134 with its second set of fan blades 136 that, when force from the deflection of the C-cover or D-cover towards the slide shaft 134 causes the second set of fan blades 136 to be moved into the first set of blades 132 mechanically coupled to the main shaft 130. In an embodiment, the second set of fan blades 136 of the slide shaft 134 may be mechanically coupled to the first set of blades 132 of the main shaft 130 such that movement of the second set of fan blades 136 along the first set of blades 132 does not prevent the variable height fan 128 from operating. In another embodiment, the individual blades of the second set of fan blades 136 mechanically coupled to the slide shaft 134 may pass between individual blades of the first set of blades 132 mechanically coupled to the main shaft 130. In this embodiment, the orientation of the slide shaft 134 relative to the main shaft 130 may be set such that the individual blades of the second set of fan blades 136 do not interfere with the movement of the first set of blades 132 vertically when increasing or decreasing the height of the variable height fan 128.

In any embodiment, the movement of the second set of fan blades 136 relative to the first set of blades 132 may be conducted whether the variable height fan 128 is operating (e.g., turning) or not. Because the main shaft 130 is, in an embodiment, magnetically coupled to an electromagnet, the main shaft 130 may be maintained at a specific location relative to that electromagnet. The slide shaft 134 may be mechanically coupled to the main shaft 130 such that as the main shaft 130 rotates, the slide shaft 134 also rotates. The mechanically coupling of the slide shaft 134 to the main shaft 130 may be such that rotation of the slide shaft 134 relative to the main shaft 130 causes the second set of fan blades 136 to rotate concurrently with the first set of fan blades 132.

The information handling system 100 may also include a biasing member 138 formed between a top portion of the slide shaft 134 and an interior portion of the main shaft 130. The biasing member 138 may cause the slide shaft 134 to be biased away from the main shaft 130 such that the overall thickness of the first set of blades 132 and second set of fan blades 136 is maximized. As described herein, the biasing force produced by the biasing member 138 is overcome as the portion of the D-cover is deflected into the variable height fan 128. Again, the deflection of the D-cover into the variable height fan 128 causes the movement of the slide shaft 134 and second set of fan blades 136 upwards instead of the D-cover contacting the slide shaft 134 or second set of fan blades 136. This prevents damage to the second set of fan blades 136 and the variable height fan 128 generally as will become apparent in this specification. In a specific embodiment, the biasing member 138 may be eliminated and the slide shaft may extend the height of the variable height fan due to gravity pulling the slide shaft and second set of fan blades 136 down. In this embodiment, the slide shaft may be set lower in the variable height fan 128 than the first set of fan blades 136. In another embodiment, the variable height fan 128 may be mounted under a C-cover. In this embodiment, the C-cover may include a C-cover inlet vent that may, similar to the D-cover inlet vent described herein, may be deflected into the variable height fan 128. In this embodiment, the biasing force produced by the biasing member 138 is overcome as the portion of the C-cover is deflected into the variable height fan 128. Again, the deflection of the C-cover into the variable height fan 128 causes the movement of the slide shaft 134 and second set of fan blades 136 downwards instead of the C-cover contacting the slide shaft 134 or second set of fan blades 136. This prevents damage to the second set of fan blades 136 and the variable height fan 128 generally as will become apparent in this specification.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
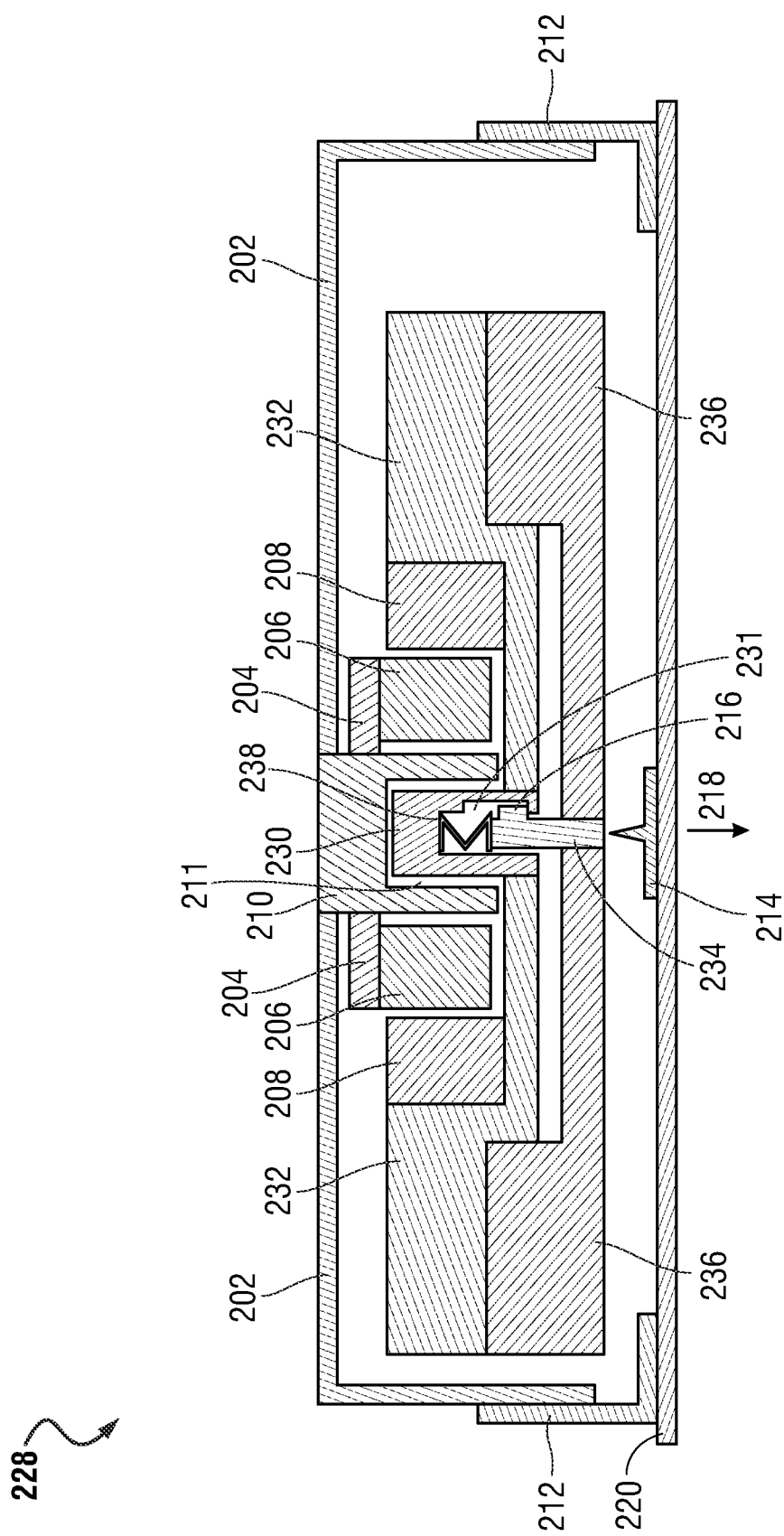
FIG. 2 is a graphical illustration of a side, cut-out view of a variable height fan according to an embodiment of the present disclosure.

FIG. 2 is a graphical illustration of a side, cut-out view of a variable height fan 228 according to an embodiment of the present disclosure. The variable height fan 228 may be placed within any information handling system or any other system that may be cooled by the operation of the variable height fan 228. The present specification describes the use of the variable height fan 228 within a laptop-type information handling system as described herein. In this embodiment, the variable height fan 228 may include a top fan chassis 202 and a bottom fan chassis 212 to house the variable height fan 228 within a chassis of the laptop-type information handling system.

In the embodiment shown in FIG. 2, the bottom fan chassis 212 may slidably couple to the top fan chassis 202 such that the bottom fan chassis 212 may move relative to the top fan chassis 202 allowing a dynamic change in height. The bottom fan chassis 212 may move relative to the top fan chassis 202 when, for example, a force is applied to the bottom fan chassis 212 when the D-cover 220 (or, alternatively, a C-cover 220), depending on the orientation of the variable height fan 228 in the information handling system, is deformed into the variable height fan 228. In a specific embodiment, the bottom fan chassis 212 may be coupled to a portion of the D-cover 220 (or, alternatively, a C-cover 220) of the information handling system with the top fan chassis 202 being mechanically coupled to an interior portion of the base chassis of the information handling system or to the C-cover as described herein. In the embodiments described herein, the "bottom" of the variable height fan 228 may be closest to the D-cover 220. As such, the D-cover 220 may serve as an air inlet for air to enter the variable height fan 228. In these embodiments, the D-cover 220 may include holes or slats (not shown) formed as one inlet vent into a D-cover inlet vent that allow the air to pass through the D-cover inlet vent, into the variable height fan 228 and throughout the information handling system. The base chassis may have other vents placed elsewhere such as at the sides or back of the base chassis. Because the D-cover 220 at the D-cover inlet vent is structurally weak, the D-cover 220 may be relatively more deformable at the D-cover inlet vent in some aspects. When a force is applied to the D-cover inlet vent either purposefully or accidentally, the D-cover may be prevented from damaging the variable height fan 228 as a result of the dual sets of fan blades and the arrangement of the main shaft 230 and slide shaft 234 as described herein.

In another embodiment, the D-cover shown in FIG. 2 may be a C-cover 220 of the information handling system. In this embodiment, the C-cover 220 may include holes or slats (not shown) formed as one inlet vent into a C-cover inlet vent that allow the air to pass through the C-cover inlet vent, into the variable height fan 228 and throughout the information handling system. The base chassis may have other vents placed elsewhere such as at the sides or back of the base chassis. Because the C-cover 220 at the C-cover inlet vent is structurally weak, the C-cover 220 may be relatively more deformable at the C-cover inlet vent in some aspects. When a force is applied to the C-cover inlet vent either purposefully or accidentally, the C-cover may be prevented from damaging the variable height fan 228 as a result of the dual sets of fan blades and the arrangement of the main shaft 230 and slide shaft 234 as described herein.

The variable height fan 228 may include a bearing 210 placed at about a central location on a surface of the top fan chassis 202. In a specific embodiment, the bearing 210 is a sleeve bearing that is a precisely fit bearing and shaft assembly including a lubricant such as silicone grease or other known lubricant to allow for rotation while minimizing friction. This may also be referred to as a bushing bearing or fluid bearing. In other embodiments, the bearing 210 may include a set of ball bearings or incorporate a ball bearing used to allow the main shaft 230 to rotate therein. Other types of bearings may be used including roller bearings among others. In an embodiment, the bearing 210 may be fixedly coupled to other structural devices within the information handling system such as the C-cover. In a specific embodiment, the bearing 210 may be press fit into a hole defined in the top fan chassis 202 such that the press fitting process prevents the bearing 210 from moving or rotating relative to the top fan chassis 202. The bearing 210 may be part of the mechanical structure provided within the variable height fan 228 during the operation of the variable height fan 228. In an embodiment, the bearing 210 may be used as the structural support for a printed circuit board (PCB) 204 used to control the operation of the variable height fan 228. In a specific embodiment, the PCB 204 may include circuitry that electrically couples a processor of the variable height fan 228 with an electromagnet 206 structurally supported by the bearing 210 and the PCB 204. As described herein, a processor executing a fan module may be used to control the operation of the variable height fan 228 based on, for example, detected temperatures within the information handling system or processes executed by the processor. Upon the receipt of signals from the processor, the circuitry of the PCB 204 may be used to selectively activate the electromagnet 206 so that the permanent magnet or magnets 208 mechanically coupled to the first set of fan blades 232 may be turned. Specifically, as power is passed through the electromagnet 206, a magnetic field is created that interacts with a magnetic field of the permanent magnet 208 mechanically coupled to the first set of fan blades 232. In these embodiments, the activation of the electromagnet 206 may be sequential such that different sets of electromagnets 206 mechanically coupled to the PCB 204 and bearing 210 are "fired" sequentially so that the permanent magnets 208 and the first set of fan blades 232 are rotated about the bearing shaft 210 and electromagnet 206.

The bearing 210 may be operatively coupled to the first set of fan blades 232 via the main shaft 230. In the embodiment shown in FIG. 2, main shaft 230 is rotatably coupled to the bearing 210 via, for example a ball bearing or other slidable mechanical coupling that allows the main shaft 230 to rotate relative to the bearing shaft 210. For example, the main shaft 230 may be inserted into a receiver chamber or cavity 211 of the bearing 210 as depicted and allowing fan rotation. In an embodiment, the activation of the electromagnet 206 may cause the main shaft 230, first set of fan blades 232, and permanent magnets 208 to remain magnetically coupled to the electromagnet 206 and bearing shaft 210. In a specific embodiment, all electromagnets 206 placed around the bearing 210 may be activated so that, although the first set of fan blades 232 are not to be rotating, the vertical placement of the main shaft 230, first set of fan blades 232, and permanent magnets 208 is maintained. In this embodiment, when the main shaft 230 and first set of fan blades 232 are to be rotating, the electromagnets 206 may be made to fire sequentially as described in order to both rotate the first set of fan blades 232 and maintain the vertical placement of the first set of fan blades 232 and main shaft 230 in an example embodiment.

In an embodiment, the main shaft 230 may be mechanically coupled to a slide shaft 234. In an embodiment, the main shaft 230 includes a receiving cavity 231 formed along a central axis of the main shaft 230 to place the slide shaft 234 or a length of the slide shaft 234 therein. In other embodiments, the reverse may be utilized with the main shaft 230 coupled inside a receiving cavity formed in the slide shaft 234. In a specific embodiment, the slide shaft 234 may be coupled to the main shaft 230 via use of a spline 216 and a corresponding groove or notch on the main shaft 230. The spline 216 may be any type of mating feature that mates with an interior surface of the main shaft 230 such that the slide shaft 234 rotates along with the main shaft 230 in other embodiments. In this embodiment, the spline 216 may mechanically interface with a notch or a groove formed within or along the main shaft 230 such that, as the main shaft 230 rotates, the slide shaft 234 concurrently rotates as well. The concurrent rotation of the slide shaft 234 with the main shaft 230 causes the rotation of the first set of fan blades 232 with the second set of fan blades 236 about the bearing shaft 210. With the inclusion of the spline 216, the slide shaft 234 may be prevented from slidably disengaging from the main shaft 230 in an embodiment.

The variable height fan 228 may also include a biasing member 238 placed between the main shaft 230 and slide shaft 234. In an embodiment, the biasing member 238 is a spring. In an embodiment, the biasing member 238 is a ribbon spring. In an embodiment, the biasing member 238 is compressible gas that is maintained between the interior of the main shaft 230 and the slide shaft 234. In an embodiment, the biasing member 238 may be part of a hydraulic system that selectively biases the slide shaft 234 downward from the main shaft 230. The biasing member 238 biases the slide shaft 234 away from the main shaft 230 in the downward direction 218 as indicated by the arrow. As the biasing member 238 biases the slide shaft 234 downward from the main shaft 230, the height of the variable height fan 228 is increased to a maximum height. In an embodiment, with the placement of the spline 216, the slide shaft 234 may also be prevented from exiting entirely the receiving cavity 231 formed in the main shaft 230 that the slide shaft 234 is placed within.

In an embodiment, the variable height fan 228 includes a contact point prominence 214 or other rotation interface. The contact point prominence 214 may form part of the bottom fan chassis 212 or the D-cover 220 as described herein. The contact point prominence 214 may mechanically interface with the slide shaft 234 such that any force against the bottom fan chassis 212 or D-cover 220 causes a pointed or protruding surface on the contact point prominence 214 to press against the slide shaft 234 causing the slide shaft 234 to pass further into the cavity 231 formed in the main shaft 230 as shown in FIG. 2. Without that force against the contact point prominence 214, the biasing member 238 causes the slide shaft 234 to extend out of that cavity 231 formed in the main shaft 230 to a maximized height. The contact point prominence 214 may be a metal, plastic, or other material rod or spike that is shaped into an extension that rotationally interfaces with the slide shaft 234 which also vertically engages the slide shaft 234. In some embodiments, a notch or rounded groove may be present in the slide shaft 234 to ensure a contact point fit in yet other embodiments, the contact point prominence structure may be of any shape to support the slide shaft 234 and also permit its rotation.

Figure 3:
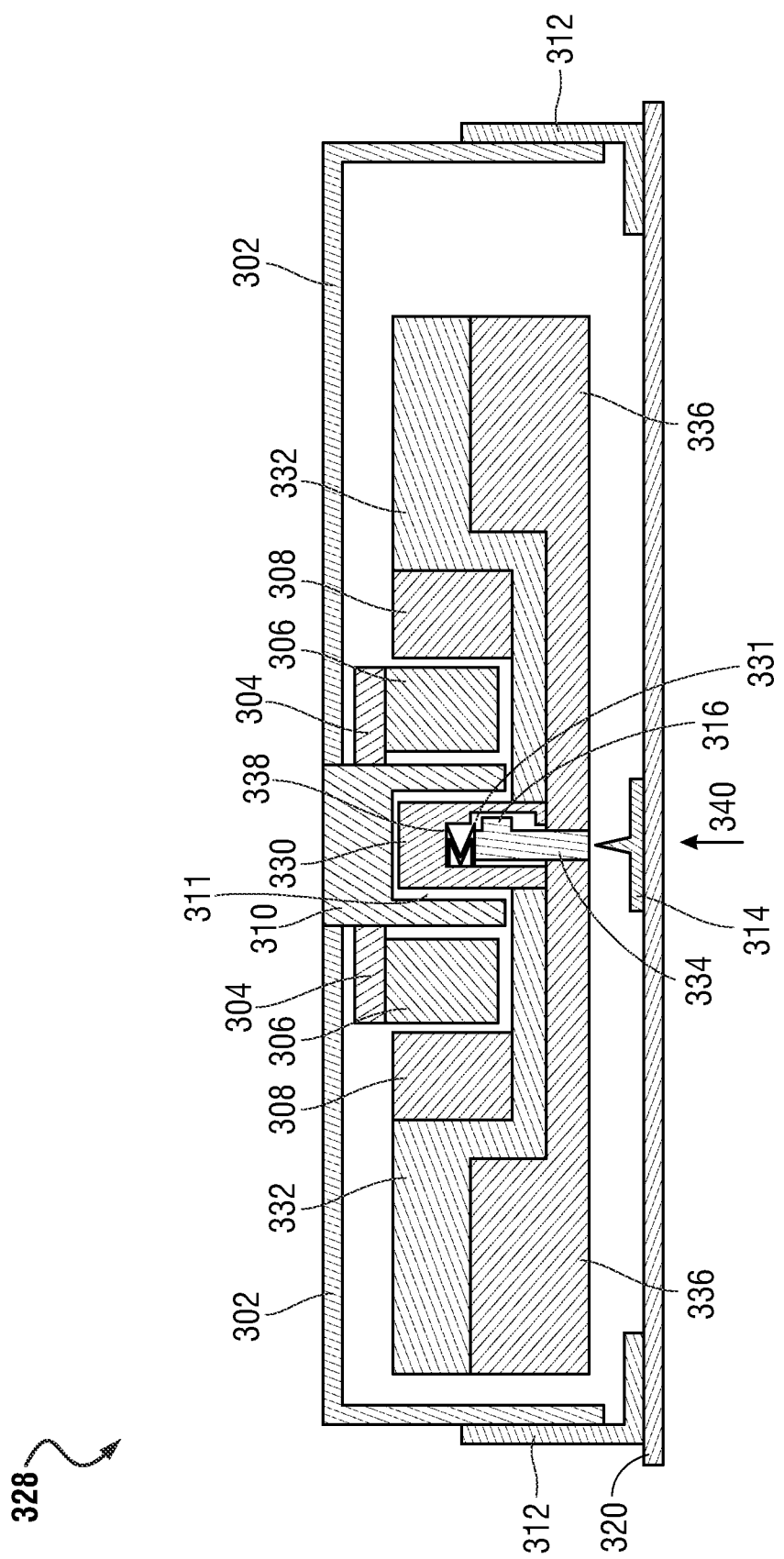
FIG. 3 is a graphical illustration of a side, cut-out view of a variable height fan according to another embodiment of the present disclosure.

FIG. 3 is a graphical illustration of a side, cut-out view of a variable height fan 328 according to another embodiment of the present disclosure. The variable height fan 328 may be similar and include similar elements as that variable height fan 228 described in connection with FIG. 2. Specifically, the variable height fan 328 may include a top fan chassis 302 that is slidably coupled to a bottom fan chassis 312. Top fan chassis and bottom fan chassis 312 may move with respect to one another to accommodate the variable height operation of the variable height fan of various embodiments herein. The variable height fan 328 may also include a bearing 310 that is mechanically coupled to a PCB 304, and an electromagnet 306. In a specific embodiment, the bearing 310 is a sleeve bearing that is a precisely fit bearing and shaft assembly including a lubricant such as silicone grease or other known lubricant to allow for rotation of the main shaft 330 while minimizing friction. In other embodiments, the bearing 310 may include a set of ball bearings, roller bearings, or other type of bearing to allow the main shaft 330 to rotate therein. The variable height fan 328 also includes the main shaft 330 placed within a cavity 311 formed in the bearing 310 that is, in an embodiment, mechanically coupled to the bearing 310 via, for example, a bearing system. In a separate embodiment, the main shaft 330 is magnetically coupled to the bearing 310 via the magnetic interaction between the permanent magnets 308 placed on the first set of fan blades 332 mechanically coupled to the main shaft 330 and the electromagnet 306 mechanically and electrically coupled to the PCB 304 and bearing 310.

In FIG. 3, the contact point prominence 314 has abutted the slide shaft 334 such that the force applied to the contact point prominence 314 is transferred to the slide shaft 334 so that the slide shaft 334 moves further into the cavity 331 formed in the main shaft 330. Force applied on the contact point prominence 314 may be from force being applied to a D-cover 320 (or, alternatively, a C-cover 320) of the information handling system such as in direction arrow 340.

In another embodiment, the variable height fan 328 may be mounted under a C-cover. In this embodiment, the C-cover may include a C-cover inlet vent that may, similar to the D-cover inlet vent described herein, may be deflected into the variable height fan 328. In this embodiment, the biasing force produced by the biasing member 338 is overcome as the portion of the C-cover is deflected into the variable height fan 328. Again, the deflection of the C-cover into the variable height fan 328 causes the movement of the slide shaft 334 and second set of fan blades 336 downwards instead of the C-cover contacting the slide shaft 334 or second set of fan blades 336. This prevents damage to the second set of fan blades 336 and the variable height fan 328 generally as will become apparent in this specification.

As described herein, the contact point prominence 314 may form part of a bottom fan chassis 312 or, in an alternative embodiment, part of the D-cover 320 (or, alternatively, a C-cover 320) of a laptop-type information handling system. In the embodiments described herein, the contact point prominence 314 may form part of a D-cover inlet vent that is placed below or above the variable height fan 328. When the D-cover or C-cover near the variable height fan 328 is deformed in a compressive direction 340 and into the chassis of the variable height fan 328 as shown in FIG. 3, the contact point prominence 314 may mechanically abut the slide shaft 334 placed within the main shaft 330 as described herein. When this occurs, the bias against the slide shaft 334 produced by the biasing member 338 may be overcome and the slide shaft 334 may be moved vertically into the cavity 331 formed in the main shaft 330. Although the spline 316 prevents the slide shaft 334 from rotating faster or slower than the main shaft 330, the spline 316 does not prevent vertical movement of the slide shaft 334 relative to the main shaft 330 until a maximum or minimum height is realized in some embodiments.

FIG. 3 shows the variable height fan 328 in a compressed state having a smaller fan height than as shown in FIG. 2. As the slide shaft 334 moves further up into the cavity 331 formed in the main shaft 330, the second set of fan blades 336 coupled to the slide shaft 334 may intertwine, interlace, or otherwise move into the first set of fan blades 332 mechanically coupled to the main shaft 330. In one specific embodiment, each fan blade of the second set of fan blades 336 maybe slidably and mechanically coupled to a corresponding fan blade among the first set of fan blades 332. In this embodiment, this may be done by including a sliding hook on each of the first set of fan blades 332 to interface with the blades of the second set of fan blades 336 to link rotation of the first set of fan blades 332 to the second set of fan blades 336. In an alternative embodiment, each of the blades of the first set of fan blades 332 may be placed such that each blade of the second set of fan blades 336 may pass between them taking advantage of the negative space between the blades of the first set of fan blades 332. In either of these embodiments, the height of the variable height fan 328 is reduced as the D-cover or C-cover pushes the slide shaft 334 up into the cavity 331 formed in the main shaft 330. When the force against the D-cover or C-cover is eliminated, the biasing member 338 is allowed to bias the slide shaft 334 out of the cavity 331 formed in the main shaft 330 thereby increasing the height of the variable height fan 328.

As described herein, the distance between the bottom of the second set of fan blades 336 and the interior surface of the D-cover 320 (or, alternatively, a C-cover 320) may be a small as 0.5 mm thereby allowing for a greater amount of space within the chassis of the variable height fan 328 that in other types of fans. In some examples, other types of fan must include an air gap that reserves as much as 2 mm of distance below the fan in order to provide space for the deformation of the D-cover (or, alternatively, a C-cover 320) into the fan chassis. This air gap must be present in order to prevent the D-cover from touching and damaging the fan. Because of the additional height achieved via implementation of the variable height fan 328 described herein, the fan may be larger or the space within the base chassis of the information handling system may be reduced. Still further, the amount of airflow through the variable height fan 328 may meet or exceed the amount of airflow achievable by these other types of fans while still allowing for the operation of the fan when the D-cover 320 (or, alternatively, a C-cover 320) is deflected as described herein.

Figure 4:
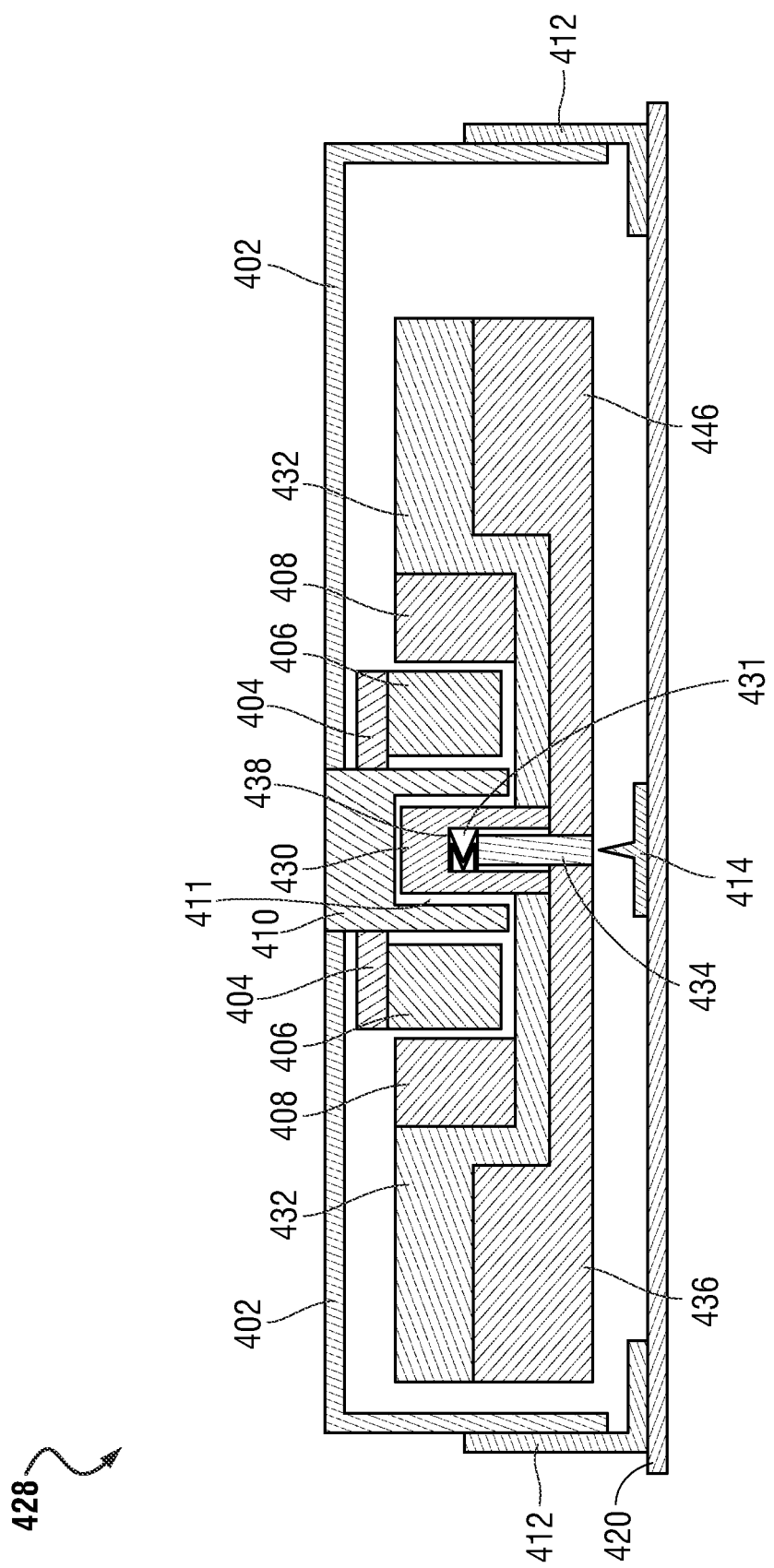
FIG. 4 is a graphical illustration of a side, cut-out view of a variable height fan according to another embodiment of the present disclosure.

FIG. 4 is a graphical illustration of a side, cut-out view of a variable height fan 428 according to another embodiment of the present disclosure. Again, the variable height fan 428 may be similar and include similar elements as that variable height fan 228, 328 described in connection with FIGS. 2 and 3. Specifically, the variable height fan 428 may include a top fan chassis 402 that is slidably coupled to a bottom fan chassis 412. The variable height fan 428 may also include a bearing 410 that is mechanically coupled to a PCB 404, and an electromagnet 406. In a specific embodiment, the bearing 410 is a sleeve bearing with lubricant used to allow the main shaft 430 to rotate with limited friction therein. Other types of bearings may be used including ball bearings or roller bearings among others. The variable height fan 428 also includes the main shaft 430 placed within a cavity 411 formed in the bearing 410 that is, in an embodiment, mechanically coupled to the bearing 410 via, for example, a bearing system. In a separate embodiment, the main shaft 430 is magnetically coupled to the bearing 410 via the magnetic interaction between the permanent magnets 408 placed on the first set of fan blades 432 mechanically coupled to the main shaft 430 and the electromagnet 406 mechanically and electrically coupled to the PCB 404 and bearing 410.

FIG. 4 shows an embodiment where the slide shaft 434 is not mechanically coupled directly to the main shaft 430 via using the spline as described herein. In the other embodiments described herein, the slide shaft 434 includes a spline that interfaces with mating features formed on the interior surface of the cavity 431 formed in the main shaft 430. However, other mechanical features may prevent the slide shaft 434 from completely exiting the cavity 431 formed in the main shaft 430 and used to house the sliding slide shaft 434 such as the bottom fan cover 412 or the D-cover 420 (or, alternatively, a C-cover 420) disposed below or above the slide shaft 434 and contact point prominence 414.

The contact point prominence 414 is shown to be abutting the slide shaft 434 in FIG. 4 such that the force applied to the contact point prominence 414 is transferred to the slide shaft 434 so that the slide shaft 434 moves further into the cavity 431 formed in the main shaft 430. Force applied on the contact point prominence 414 may be from force being applied to a D-cover 420 (or, alternatively, a C-cover 420) of the information handling system.

In another embodiment, the variable height fan 428 may be mounted under a C-cover. In this embodiment, the C-cover may include a C-cover inlet vent that may, similar to the D-cover inlet vent described herein, may be deflected into the variable height fan 428. In this embodiment, as a portion of the C-cover is deflected into the variable height fan 428, such deflection of causes the movement of the slide shaft 434 and second set of fan blades 436 downwards instead of the C-cover contacting the slide shaft 434 or second set of fan blades 436. This prevents damage to the second set of fan blades 436 and the variable height fan 428 generally.

In various embodiments herein, the variable height fan 428 may be in any orientation in an information handling system chassis depending on the form factor of the information handling system. Thus, although alignment over a D-cover or under a C-cover for a blower fan system with a variable height fan is described in embodiments herein, it is contemplated that the variable height fan may be used in any orientation for a blower fan subject to external compressive forces, such as in a vehicle or other location, to allow for blower fan air movement within a chassis with optimized fan blade height.

In an embodiment, the contact point prominence 414 may prevent the slide shaft 434 form exiting the main shaft 430. In this embodiment, height of the contact point prominence 414 may be set so that the maximum height of the variable height fan 428 is achieved while also preventing the complete removal of the slide shaft 434 from the cavity 431 formed in the main shaft 430 by operative coupling to the D-cover 420 (or, alternatively, a C-cover 420) which limits height expansion of the variable height fan 428.

Figure 5B:
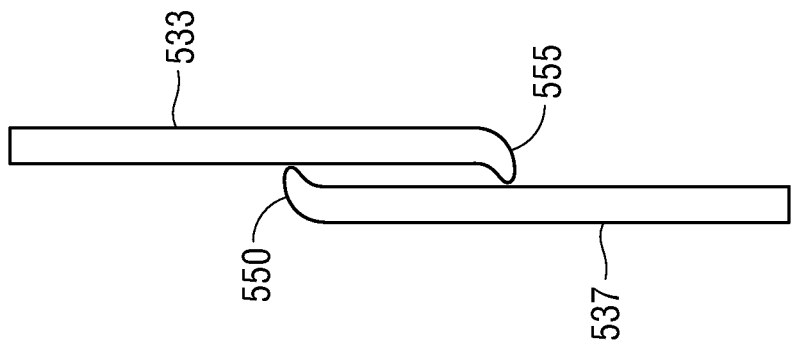
FIG. 5B is a graphical side, cut-out view of an interface between a first set of fan blades relative to a fan blade of a second set of fan blades according to another embodiment of the present disclosure.
Figure 5A:
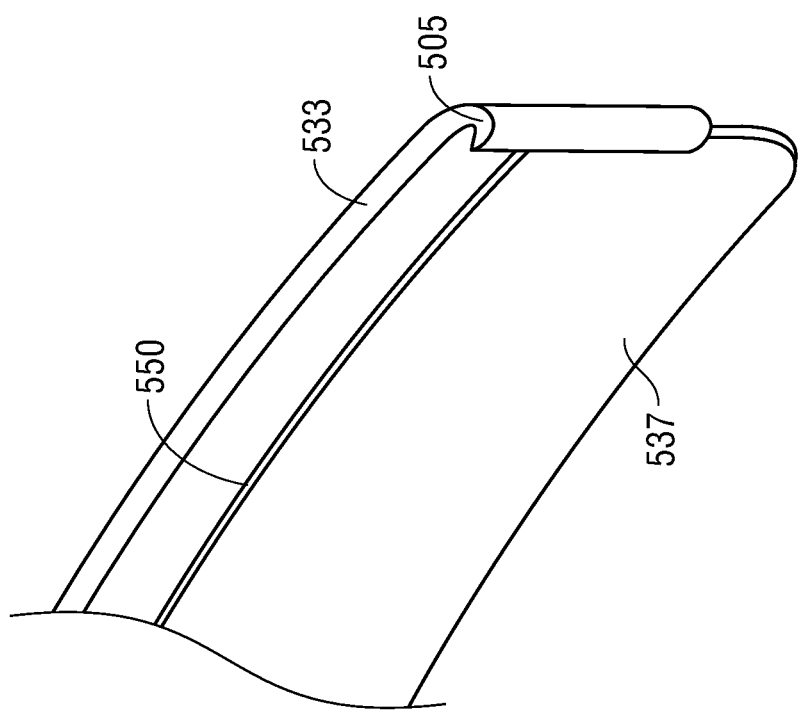
FIG. 5A is a graphical perspective view of a fan blade of a first set of fan blades relative to a fan blade of a second set of fan blades according to an embodiment of the present disclosure.

In other embodiments, the second set of fan blades 436 and first set of fan blades 432 of the slide shaft 434 and main shaft 430, respectively, may include securing features that prevent the total vertical separation of second set of fan blades 436 from the first set of fan blades 432. In an embodiment, each blade of the second set of fan blades 436 may be slidably coupled to one of the blades of the first set of fan blades 432. When the fan height is at its maximum, the height of each of the blades is extended with this coupling. In one example embodiment, a top edge of each of the second set of fan blades 436 may include a stop lip that abuts with a corresponding stop lip formed on a bottom lip of each of the blades of the first set of fan blades 432 limiting the extension for the first set of fan blades 432 relative to the second set of fan blades 436. This prevents the separate of each of the first set of fan blades 432 from corresponding blades of the second set of fan blades 436 thereby preventing the removal of the slide shaft 434 from the main shaft 430. FIGS. 5A and 5B shows this specific arrangement where each of the blades of the first set of fan blades 432 abuts a corresponding blade of the second set of fan blades 436 with embodiments to limit the vertical or rotational movement between the first set of fan blades 432 and the second set of fan blades 436 in some embodiments.

FIG. 5A is a graphical perspective view of a first fan blade 533 of a first set of fan blades relative to a second fan blade 537 of a second set of fan blades according to an embodiment of the present disclosure. FIG. 5B is a graphical side, cut-out view of an interface between the first fan blade 533 of the first set of fan blades relative to the second fan blade 537 of the second set of fan blades according to an embodiment of the present disclosure. FIG. 5A shows a edge lip 505 formed at an outer or distal end of the first fan blade 533. The edge lip 505 may be used to operatively and mechanically couple the first fan blade 533 and second fan blade 537 with the second fan blade 537 extending vertically past the first fan blade 533 a distance. Any structural extension of either first fan blade 533 or second fan blade 537 may be used to engage the other to limit rotational separation while allowing vertical sliding with respect to one another. For example, a finger, spline, groove, or other structure may be used. Further, in some embodiments only one set of first fan blade 533 and second fan blade 537 need be limited with respect to each other for rotational separation, but more than one fan blade may be used. In an alternative example embodiment, the reverse orientation may also be used with the edge lip 505 being formed on the distal end of the second fan blade 537 to mechanically couple the first fan blade 533 to the second fan blade 537. In these embodiments, the operative surface, the surfaces of the blades 533 and 537 that push air, may be dynamically extended and retracted based on whether the slide shaft moves out of or into the cavity formed within the main shaft, respectively, as described herein. The embodiments of FIG. 5A, however, provides for limits on relative rotational movement of the first fan blade 533 to the second fan blade 537 but may permit vertical movement in some example embodiments.

Turning now to FIG. 5B, the first fan blade 533 and second fan blade 537 are shown to be mechanically interfacing with each other according to another example embodiment. As described, a bottom edge of the first fan blade 533 may include a first lip 555. During deployment, a second lip 550 formed on the top edged of the second fan blade 537 may interface with the first lip 555 to prevent the vertical separation of the second fan blade 537 from the first fan blade 533 beyond a maximum height expansion amount and, accordingly, the removal of the slide shaft from the cavity formed in the main shaft as described herein. Again, other limiting structures may be used including a notch, rail, raised plateau, or other structural feature that may limit vertical movement of the first fan blade 533 with respect to the second fan blade 537 or vice-versa.

FIGS. 5A and 5B show example embodiments of a first set of fan blades relative to another set of fan blades. However, the embodiment shown and described in these figures is meant merely as an example arrangement. In an embodiment, the first fan blade 533 and second fan blade 537 of the first set of fan blades and second set of fan blades, respectively, may not make contact with each other. In this embodiment, the second set of fan blades that are mechanically coupled to the slide shaft may be spaced among the first set of fan blades that are mechanically coupled to the main shaft such that the two sets of fan blades are interspersed among each other. Because, in an embodiment where the slide shaft and main shaft are linked rotationally, the speed of rotation of the slide shaft is fixed to the speed of rotation of the main shaft, the first set of fan blades and the second set of fan blades may not make contact. In this embodiment, the additional set of fan blades in the second set of fan blades may provide additional airflow within the variable height fan increasing the efficiency of the variable height fan to expel heat from the information handling system. This may increase the operational efficiency of the information handling system as well as reduce wear and tear of the variable height fan.

Figure 6:
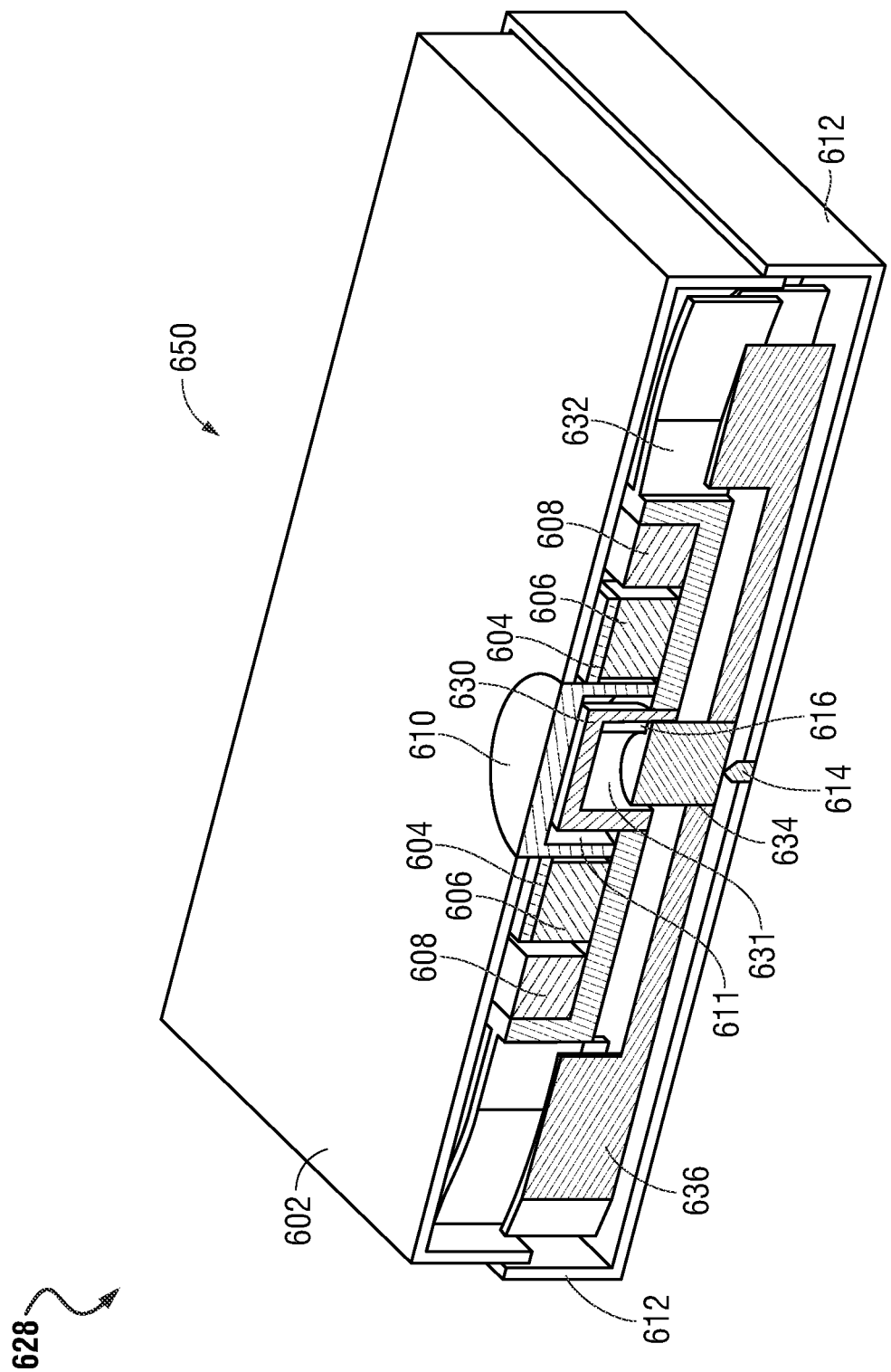
FIG. 6 is a perspective, graphical, cut-out view of a variable height fan according to an embodiment of the present disclosure.

FIG. 6 is a perspective, graphical, cut-out view of a variable height fan 600 according to an embodiment of the present disclosure. In an embodiment, the variable height fan 628 may be mounted over a D-cover intake vent. In another embodiment, the variable height fan 628 may be mounted below a C-cover intake vent. In either embodiment, the variable height fan 628 may intake air through the D-cover intake vent or C-cover intake vent, pass air throughout the information handling system, and out of a heat exhaust vent.

Similar to other embodiments described herein, the variable height fan 628 of FIG. 6 may include a top fan chassis 602 that is slidably coupled to a bottom fan chassis 612. The variable height fan 628 may also include a bearing 610 that is mechanically coupled to a PCB 604, and an electromagnet 606. In a specific embodiment, the bearing 610 is a sleeve bearing or incorporates a sleeve bearing with lubricant used to allow the main shaft 630 to rotate therein. Other types of bearings may be used including ball bearings or roller bearings among others. Although the electromagnet 606 is described herein as being an electromagnet, the present specification contemplates that other types of magnetic devices, including permanent magnets and combinations of permanent magnets and electromagnets may be used. In the embodiments described herein, the electromagnet 606 may be magnetically coupled to one or more permanent magnets 608.

The variable height fan 628 also includes the main shaft 630 placed within a cavity 611 formed in the bearing 610. In an embodiment, the main shaft 630 is mechanically coupled to the bearing 610 via, for example, a bearing system including a plurality of ball bearings, roller bearings, or the like. In a separate embodiment, the main shaft 630 is magnetically coupled to the bearing 610 via the magnetic interaction between the permanent magnets 608 placed on the first set of fan blades 632 mechanically coupled to the main shaft 630 and the electromagnet 606 mechanically and electrically coupled to the PCB 604 and bearing 610. In an alternative embodiment, the permanent magnets 608 may alternatively be a ferromagnetic material that is magnetically attracted to the electromagnets 606 during operation.

FIG. 6 shows an embodiment where the slide shaft 634 is mechanically coupled to the main shaft 630 via a spline 616 as described herein. In this embodiment, the spline 616 runs a vertical length of the interior of the receiving cavity 631 formed within the main shaft. The slide shaft 634 is received in the receiving cavity 631 of the main shaft 630. The slide shaft 634 may have a complimentary matching surface such as a groove formed therein that mechanically interfaces with the main shaft 630 and spline 616 to cause the slide shaft 634 to rotate at the same speed as the main shaft 630. In some embodiments, the mechanical features as described herein may prevent the slide shaft 634 from completely exiting the cavity 631 formed in the main shaft 630 and used to house the sliding slide shaft 634. Among these mechanical features may include, in some embodiments, a stopper feature to limit the vertical movement of the spline 616 to a maximum or minimum.

In some embodiments, the contact point prominence 614 may prevent the slide shaft 634 form exiting the main shaft 630 receiving cavity 631. In this embodiment, height of the contact point prominence 614 may be set so that the maximum height of the variable height fan 628 is achieved while also preventing the complete removal of the slide shaft 634 from the receiving cavity 631 formed in the main shaft 630 by a D-cover or C-cover on which the fan chassis 612 is mounted or part of.

In other embodiments, the second set of fan blades 636 and first set of fan blades 632 of the slide shaft 634 and main shaft 630, respectively, may include securing features that prevent the total rotational or vertical expansion separation of second set of fan blades 636 from the first set of fan blades 632. Examples of these securing features are shown and described in connection with FIGS. 5A and 5B. In some of these example embodiments, each blade of the second set of fan blades 636 may be slidably coupled to one of the blades of the first set of fan blades 632. When the fan height is at its maximum, the height of each of the blades is extended with this coupling. In an embodiment, where a top edge of each of the second set of fan blades 636 may include a stop lip that abuts with a corresponding stop lip formed on a bottom lip of each of the blades of the first set of fan blades 632, the first set of fan blades 632 may be prevented from fully vertically separating from corresponding blades of the second set of fan blades 636 thereby preventing the removal of the slide shaft 634 from the main shaft 630. FIGS. 5A and 5B shows this specific arrangement where each of the blades of the first set of fan blades 632 abuts a corresponding blade of the second set of fan blades 636.

In the embodiment shown in FIG. 6, the fan blades of the first set of fan blades 632 and second set of fan blades 636 may bend or wrap against a direction of rotation to form a contoured blade that moves air into and out of the variable height fan 628. In another embodiment, the blades of the first set of fan blades 632 and second set of fan blades 636 may have a helical shape such that the blades are contoured in both a vertical and horizontal axis. In this embodiment, the blades may form a corkscrew shape that pulls air into the variable height fan 628 and out of a heat exhaust vent 650 formed in a portion of the base chassis of the information handling system. An airfoil formed by the blades of the second set of fan blades 636 and variable height fan 628 may vary along the length of the individual blades and may contribute to the airflow produced by the rotating blades within the variable height fan 628.

In the embodiment shown in FIG. 6, the variable height fan 628 does not include a biasing member. In this embodiment, the slide shaft 634 may be extended, but not completely, out of the main shaft 430 as a result of gravity if oriented as shown in FIG. 6. Specifically, the second set of fan blades 636 of the variable height fan 628 may be placed vertically below the first set of fan blades 632 such that gravity separates the two set of fan blades. As the two sets of fan blades 632, 636 are separated, the height of the variable height fan 628 is maximized creating the most airflow into and out of the variable height fan 628.

As described herein, the slide shaft 634 may mechanically interface with a contact point prominence 614. The contact point prominence 614 may allow the slide shaft 634 to rotate with the main shaft 630 but also prevent the slide shaft 634 from exiting the receiving cavity 631 formed in the main shaft 630. During operation and when force is applied to the bottom fan chassis 612 or, at least, the contact point prominence 614 it may cause the second set of fan blades 636 and slide shaft 634 to move vertically upward relative to the main shaft 630 and slide shaft 634. Although this may reduce the height of the variable height fan 628, the D-cover or a portion of the bottom fan chassis 612 may be prevented from interfering with the rotation of the first set of fan blades 632 and second set of fan blades 636. This prevents damage from occurring to the sets of blades 632 and 636 as the variable height fan 628 is in operation. Once the force against the D-cover or the bottom fan chassis 612 or D-cover is released, gravity causes the second set of fan blades 636 to drop away from the first set of fan blades 632 thereby increasing the height of the variable height fan 628 again.

Figure 7:
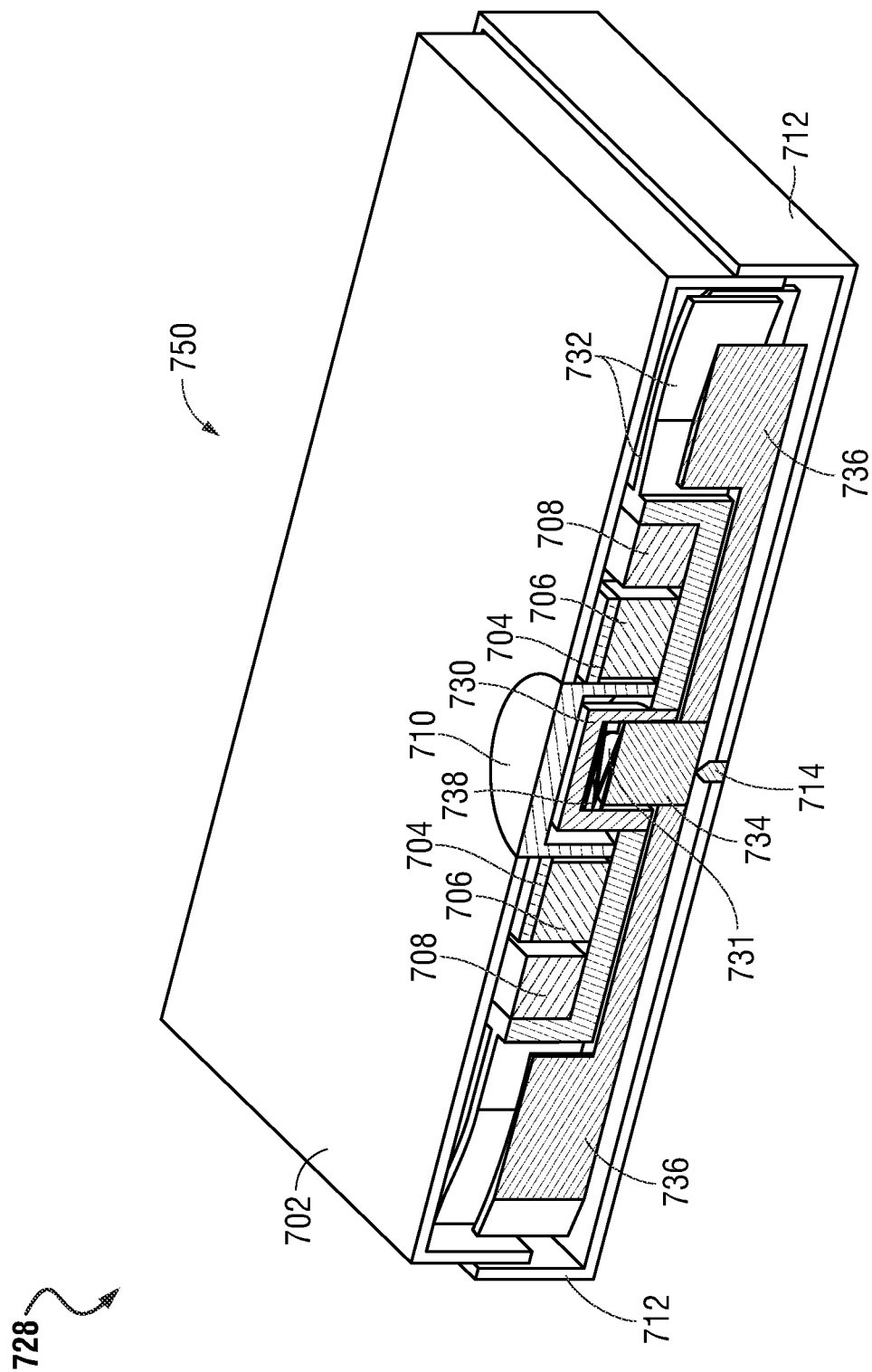
FIG. 7 is a perspective graphical view of a first set of fan blades relative to a second set of fan blades according to another embodiment of the present disclosure.

FIG. 7 is a perspective graphical view of a first set of fan blades 732 relative to a second set of fan blades 736 according to an embodiment of the present disclosure. In an embodiment, the variable height fan 728 may be mounted over a D-cover intake vent. In another embodiment, the variable height fan 728 may be mounted below a C-cover intake vent. In either embodiment, the variable height fan 728 may intake air through the D-cover intake vent or C-cover intake vent, pass air throughout the information handling system, and out of a heat exhaust vent.

In FIG. 7, unlike FIG. 6 for example, the spline is not present as shown, but may be implemented in some embodiments. In some embodiments, the mechanical interaction between the first set of fan blades 732 and the second set of fan blades 736 may cause the first set of fan blades 732 and second set of fan blades 736 to rotate relative to the bearing 710 at the same speed.

In an embodiment, the contact point prominence 714 may prevent the slide shaft 734 form exiting the main shaft 730. In this embodiment, height of the contact point prominence 714 relative to the bottom fan chassis 712 may be such that the maximum height of the variable height fan 728 is achieved while also preventing the complete removal of the slide shaft 734 from the cavity 731 formed in the main shaft 730. In the embodiment shown in FIG. 7, the contact point prominence 714 provides counteracting force against the biasing member 738 such that the contact point prominence 714 prevents the slide shaft 734 from exiting the cavity 731 formed in the main shaft 730. The contact point prominence 714 may also concentrate force applied to the D-cover or C-cover to compress the biasing member 738 and reduce the height of the variable height fan 728.

Similar to other embodiments described herein, the variable height fan 728 of FIG. 7 may include a top fan chassis 702 that is slidably coupled to the bottom fan chassis 712. The variable height fan 728 may also include a bearing 710 that is mechanically coupled to a PCB 704, and an electromagnet 706. In a specific embodiment, the bearing 710 is a sleeve bearing or may incorporate ball bearings or roller bearings used to allow the main shaft 730 to rotate therein. Although the electromagnet 706 is described herein as being an electromagnet, the present specification contemplates that other types of magnetic devices, including permanent magnets and combinations of permanent magnets and electromagnets may be used. In the embodiments described herein, the electromagnet 706 may be magnetically coupled to one or more permanent magnets 708.

In other embodiments, the second set of fan blades 736 and first set of fan blades 732 of the slide shaft 734 and main shaft 730, respectively, may include securing features that prevent the total rotational or vertical expansion separation of second set of fan blades 736 from the first set of fan blades 732. Examples of these securing features are shown and described in connection with FIGS. 5A and 5B. In some of these example embodiments, each blade of the second set of fan blades 736 may be slidably coupled to one of the blades of the first set of fan blades 732. When the fan height is at its maximum, the height of each of the blades is extended with this coupling. In some embodiments, the first set of fan blades 732 may be slidably coupled to the second set of fan blades 736 via a edge lip (not shown) formed at an outer or distal end of each blade of the first set of fan blades 732. The edge lip may be used to operatively and mechanically couple the first fan blade 533 and second fan blade 537 with the second fan blade 537 extending vertically past the first fan blade 533 a distance. In some embodiments, a bottom edge of each of the blades of the first set of fan blades 732 may include a first lip (not shown). During deployment, a second lip may be formed on the top edged of each of the blades of the second set of fan blades 736 to interface with the first lip to prevent the vertical separation of the fan blades from beyond a maximum height expansion amount and, accordingly, the removal of the slide shaft 734 from the receiving cavity formed in the main shaft 730 as described herein.

In another embodiment, where a top edge of each of the second set of fan blades 736 may include a stop lip that abuts with a corresponding stop lip formed on a bottom lip of each of the blades of the first set of fan blades 732, the first set of fan blades 732 may be prevented from fully vertically separating from corresponding blades of the second set of fan blades 736 thereby preventing the removal of the slide shaft 734 from the main shaft 730. FIGS. 5A and 5B shows these specific arrangements where each of the blades of the first set of fan blades 732 may have securing features to interface with corresponding blade of the second set of fan blades 736.

In the embodiment shown in FIG. 7, the fan blades of the first set of fan blades 732 and second set of fan blades 736 may bend or wrap against a direction of rotation to form a contour that moves air into and out of the variable height fan 728. In another embodiment, the blades of the first set of fan blades 732 and second set of fan blades 736 may have a helical shape such that the blades are contoured in both a vertical and horizontal axis. In this embodiment, the blades may form a corkscrew shape that pulls air into the variable height fan 728 and out of a heat exhaust vent 750 formed in a portion of the base chassis of the information handling system. The airfoil formed by the blades of the second set of fan blades 736 and variable height fan 728 may vary along the length of the individual blades and may contribute to the airflow produced by the rotating blades within the variable height fan 728.

FIG. 7 shows an orientation of the slide shaft 734 relative to the main shaft 730 indicative of the force applied to the contact point prominence 714 and the bottom fan chassis 712. In this orientation, the height of the variable height fan 728 is reduced as a consequence of that force. Here, the biasing member 738 has also been pressed together such that the bias produced by the biasing member 738 has been overcome by the force applied to the contact point prominence 714. Although this orientation shown in FIG. 7 may reduce the variable height fan's 728 ability to draw and pass air therethrough, this orientation may be temporary. When force is removed from the contact point prominence 714, the biasing member 738 applies force against the top of the slide shaft 734 such that the height of the variable height fan 728 is increased. Pressure against the D-cover and/or contact point prominence 714 may be intermittent due to normal operating parameters by the user. For example, in a specific embodiment, the user may occasionally and inadvertently press against the D-cover at or around the holes or slats formed to allow air to pass into the variable height fan 728. When this happens, the D-cover may press against the contact point prominence 414 which, in turn, causes the slide shaft 734 to move upward. When the user releases the force against the D-cover by, for example, placing the information handling system on a flat surface, the deflection of the D-cover no longer occurs and the variable height fan 728 may be returned to the biased height.

The variable height fan 728 designs described herein may be used within any type of mobile information handling system that may be subjected to external forces and deformation of chassis including portable consumer electronics, electronics in moving vehicles, or other environments. The present specification contemplates multiple orientations of the variable height fan 728 as described herein. In an embodiment, the top fan chassis 702 may be oriented as shown in FIG. 7 with the top fan chassis 702 placed vertically higher than the bottom fan chassis 712. In an alternative embodiment, the orientation of the variable height fan 728 may be upside down such that the bottom fan chassis 712 is vertically higher than the top fan chassis 702. In this embodiment, the biasing member may bias the second set of fan blades 736 away from the first set of fan blades 732 overcoming the gravitational forces applied to the second set of fan blades 736 in this upside-down orientation.

Figure 8:
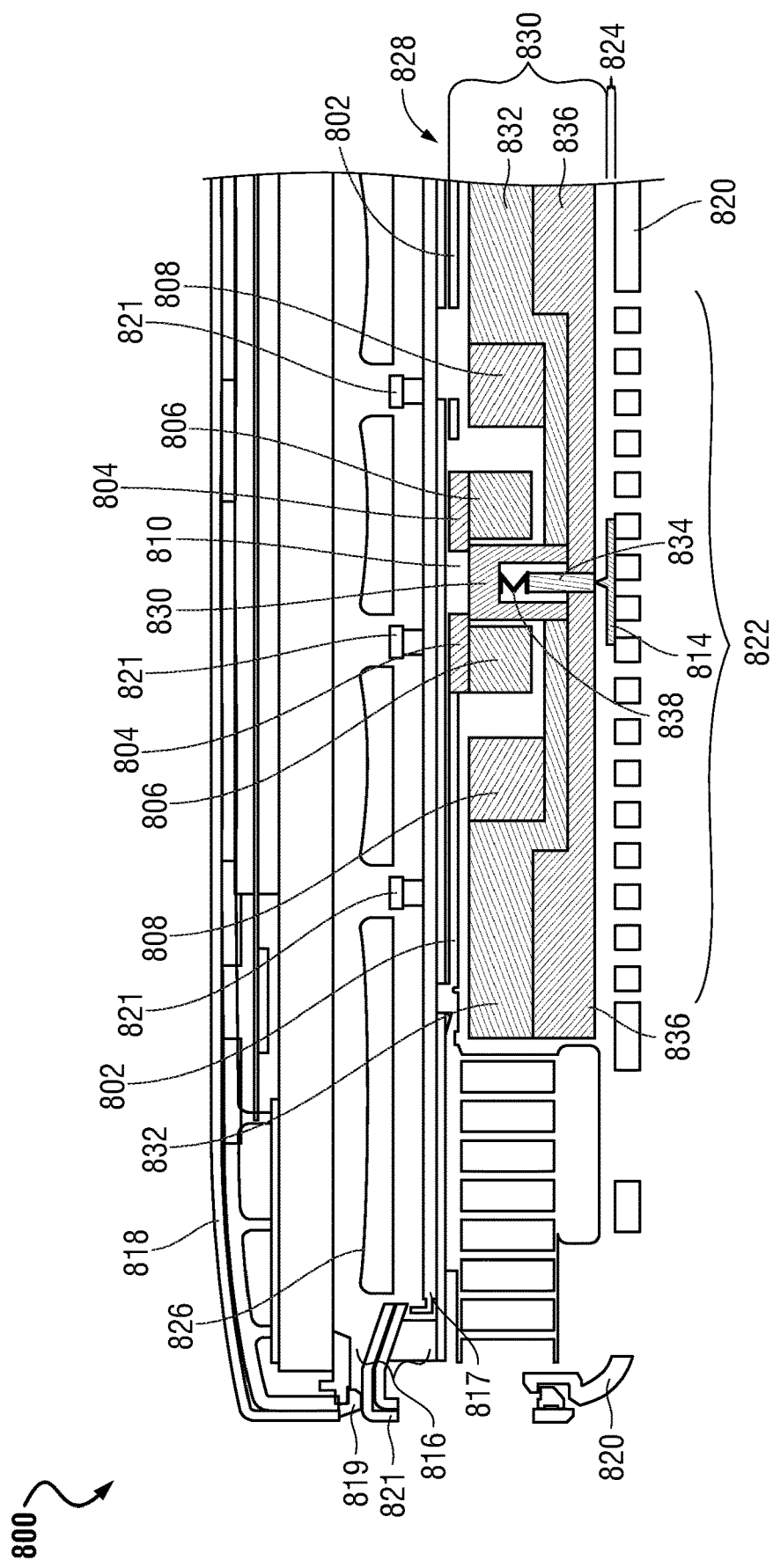
FIG. 8 is a graphical illustration side, cut-out view of an information handling system including a variable height fan according to another embodiment of the present disclosure.

FIG. 8 is a graphical illustration side, cut-out view of an information handling system 800 including a variable height fan 828 according to an embodiment of the present disclosure. As described herein, the information handling system 800 includes an A-cover 818 and a B-cover 819 that forms a display chassis. The display chassis may be used to house a display device that provides output to a user of the information handling system 800. The information handling system 800 may also include a C-cover 821 and a D-cover 820 that are coupled together to form a base chassis. The base chassis may house a plurality of devices therein including a keyboard 816 and the variable height fan 828. The keyboard 816 may include any number of keys 826 that form, for example, a QWERTY-type keyboard. Any number of keys 826 may be used to form the keyboard 816 and the present specification contemplates that any other type of input device may be incorporated into the keyboard 816 such as a trackpad. In an embodiment, the information handling system 800 includes a keyboard chassis 817. In an embodiment, the keyboard chassis 817 may support the keyboard 816. In an embodiment, the keyboard chassis 817 may be disposed between the C-cover 821 and the top fan chassis 802.

As shown in FIG. 8, the variable height fan 828 may include a top fan chassis 802. As described herein, the top fan chassis 802 may be used to secure portions of the variable height fan 828 to the base chassis of the information handling system 800 such as the base of the keyboard 816 in the C-cover 821. In some examples, the variable height fan 828 may be secured to the base chassis directly without the top fan chassis 802. For example, the variable height fan 828 may be secured to the keyboard 816, or to the C-cover 821, or to other structures in the base chassis. In an embodiment the information handling system 800 may include additional cooling systems such as heat pipes, heat sinks, vapor chambers, liquid cooling systems, and similar temperature regulation systems. In the example where heat sinks, heat pipes, and vapor chambers are used, the variable height fan 828 may be thermally coupled to other structures within the information handling system 800. In an embodiment, the variable height fan 828 may be used to pass air into the base chassis housing additional cooling devices to pass an airflow over the heat pipes, heat sinks, and vapor chambers in order to direct heat away from the components of the information handling system 800 and out of the base chassis via, for example, heat exhaust vents.

In some embodiments, the variable height fan 828 may further include a bottom fan chassis (not shown) or the D-cover 820 may serve as a bottom portion of the variable height fan 828. As described herein, the bottom fan chassis may be slidably coupled to the top fan chassis 802 such that the bottom fan chassis may move relative to the top fan chassis 802. The bottom fan chassis or D-cover 820 may move relative to the top fan chassis 802 when, for example, a force is applied to the bottom fan chassis when the D-cover 820 of the information handling system 800 is deformed into the variable height fan 828. In a specific embodiment, the bottom fan chassis may be a portion of the D-cover 820 of the information handling system 800 with the top fan chassis 802 being mechanically coupled to an interior chassis of the base chassis of the information handling system 800 or to the C-cover 821 as described herein. In some embodiments described herein, the "bottom" of the variable height fan 828 is closest to the D-cover 820, however any orientation of the variable height fan 828 is contemplated in various information handling systems form factors.

In the embodiments described herein, the D-cover 820 may serve as an air inlet for air to enter the variable height fan 828. In these embodiments, the D-cover 820 includes holes or slats formed into the D-cover 820 that form a D-cover inlet vent 822. The D-cover inlet vent 822 allows air to pass through and into the variable height fan 828 as well as throughout the information handling system 800. Because the D-cover 820 at the D-cover inlet vent 822 may be structurally weak, the D-cover 820 may be relatively more deformable at the D-cover inlet vent 822 in some embodiments. The arrangement of the first set of fan blades 832 to the second set of fan blades 836 prevents damage to the variable height fan 828 a described herein. In these embodiments, when a force is applied to the D-cover inlet vent 822 either purposefully or accidentally, the D-cover 820 may be prevented from damaging the variable height fan 828 as a result of this arrangement.

As described herein, the variable height fan 828 may include or mechanically interface with a contact point 814. The contact point 814 may be coupled to the D-cover 820 in an embodiment or to a bottom fan chassis. In another embodiment, the contact point 814 may be part of the D-cover 820 with the D-cover 820 and contact point 814 forming a monolithic piece.

As described herein, the contact point 814 may move with deformation of the D-cover 820 at the D-cover inlet vent 822. The variable height fan 828, prior to the deformation of the D-cover 820, has a maximum height 830. The maximum height may be, in some embodiments, as high as 9.4 mm with an air gap between 0.4 mm and 0.6 mm in some particular embodiments. This compares to a standard fan that must leave an air gap at a height of 1.9 mm resulting in a height of 8 mm left for the fan as an example set of descriptive dimensions for illustration purposes. The variable height fan 828 can thus increase the overall height of the fan placed in an information handling system 800 by 17.5%. This increase in height 830 results in increased potential airflow through the variable height fan 828 such that the variable height fan 828 increases the ability to cool down the systems within the information handling system 800 relative to other types of fans.

In addition to the increase in height 830 of the variable height fan 628, the air gap 824 between the lower edge of the second set of fan blades 836 and the D-cover 820 may be reduced as compared to other types of fans used in an information handling system 800. In this embodiment, the air gap 824 may be as small as 0.5 mm so that the increased height 830 of the variable height fan 828 may be accommodated. Alternatively, the air gap 824 may be reduced in length due to the arrangement of the first set of fan blades 832 to the second set of fan blades 836 allowing for a thinner fan and potentially a thinner base chassis. The operation of the variable height fan 828 as described herein may provide for both the increase in height 830 of the variable height fan 828 and the reduction of height with the air gap 824.

Specifically, during operation, the deformation of the D-cover 820 causes the contact point 814 to engage with the slide shaft 834. Because the second set of fan blades 836 are mechanically coupled to the slide shaft 834, the movement of the slid shaft 834 actuated by the contact point 814 causes the second set of fan blades 836 to move upward. At this point, the biasing force produced by the biasing member 838 is overcome allowing the second set of fan blades 836 to move upward. Here, the second set of fan blades 836 coupled to the slide shaft 834 may intertwine, interlace, or otherwise move into the first set of fan blades 832 mechanically coupled to the main shaft 830. In some specific embodiments, each fan blade of the second set of fan blades 836 maybe slidably and mechanically coupled to a corresponding fan blade among the first set of fan blades 832 to limit rotational separation or vertical expansion. In one embodiment, this may be done by including a sliding hook on each of the first set of fan blades 832 to interface with the blades of the second set of fan blades 836. In an alternative embodiment, each of the blades of the first set of fan blades 832 may be placed such that each blade of the second set of fan blades 836 may pass between them taking advantage of the negative space between the blades of the first set of fan blades 832. In either of these embodiments, the height 830 of the variable height fan 828 is reduced as the D-cover pushes the slide shaft 834 up into the cavity formed in the main shaft 830. When the force against the D-cover 820 is eliminated, the biasing member 838 is allowed to bias the slide shaft 834 in an outward direction from the cavity formed in the main shaft 830 thereby increasing the height 830 of the variable height fan 828.

Again, the variable height fan 828 may be similar and include similar elements as that variable height fan 828 described in connection with other figures described herein. Specifically, the variable height fan 828 may include a bearing 810 that is mechanically coupled to a PCB 804, and an electromagnet 806. In a specific embodiment, the bearing 810 is a sleeve bearing or incorporates a sleeve bearing used to allow the main shaft 830 to rotate therein. Other types of bearings may be used including ball bearings or roller bearings among others. The variable height fan 828 also includes the main shaft 830 placed within a cavity formed in the bearing 810 that is, in an embodiment, mechanically coupled to the bearing 810 via, for example, a bearing system. In a separate embodiment, the main shaft 830 is magnetically coupled to the bearing 810 via the magnetic interaction between the permanent magnets 808 placed on the first set of fan blades 832 mechanically coupled to the main shaft 830 and the electromagnet 806 mechanically and electrically coupled to the PCB 804 and bearing 810.

Figure 9:
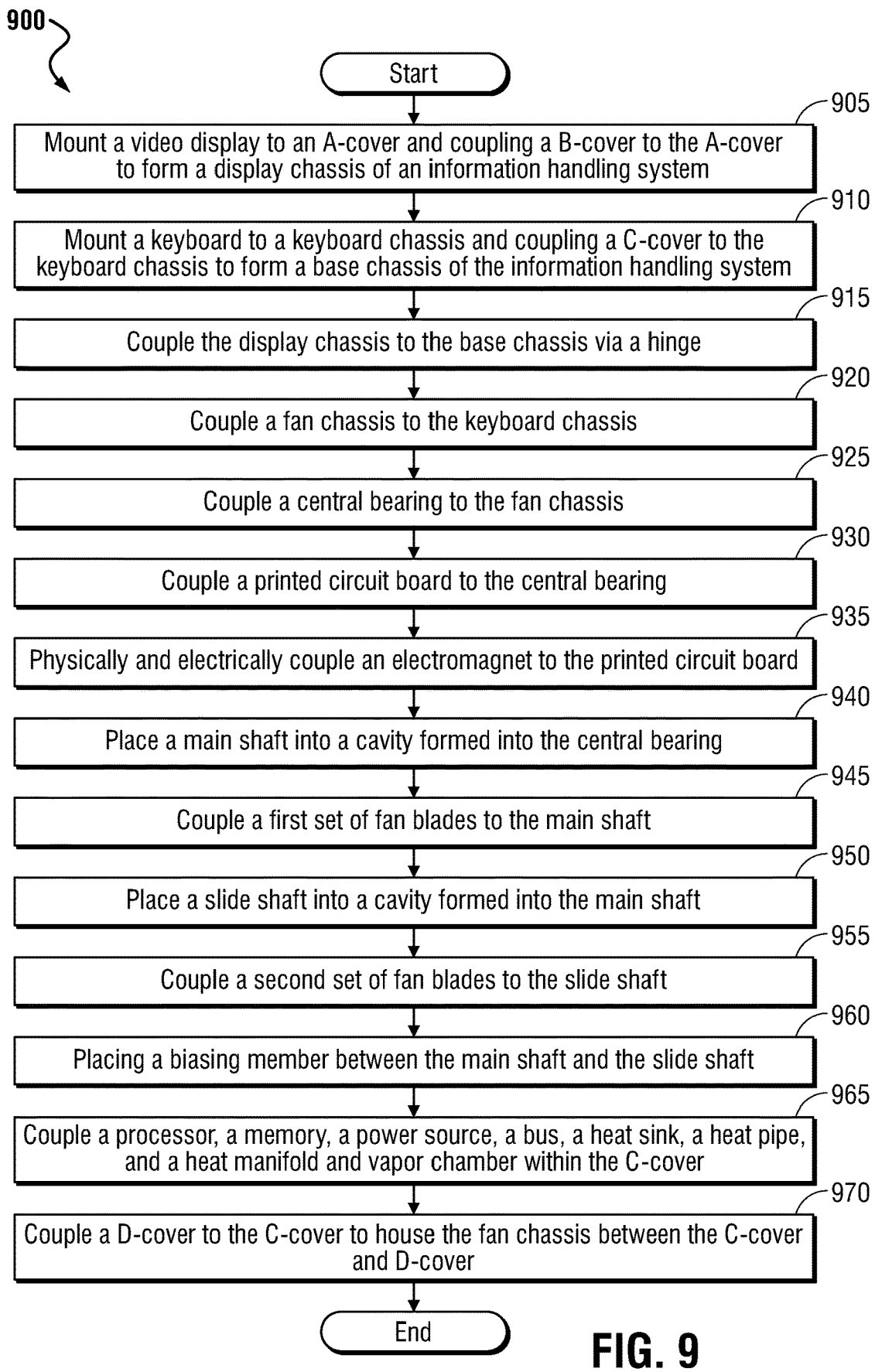
FIG. 9 is a flow diagram illustrating a method of manufacturing an information handling system according to an embodiment of the present disclosure.

FIG. 9 is a flow diagram illustrating a method 900 of manufacturing an information handling system according to an embodiment of the present disclosure. The method 900 may begin at block 905 with mounting a video display to an A-cover and coupling a B-cover to the A-cover to form a display chassis of the information handling system. The method 900 may also include, at block 910, with mounting a keyboard to a keyboard chassis and coupling a C-cover to the keyboard chassis to form a portion of the base of the information handling system. The display chassis and the base chassis may then by coupled together via a hinge a block 915. This may form a semi-complete information handling system without the D-cover assembled thereto in an embodiment.

The method 900 may also include coupling a fan chassis to the keyboard chassis at block 920. As described herein, the coupling of a fan chassis may not be completed and the central bearing of the variable height fan may be directly coupled to the keyboard chassis or other structure serving as a top fan chassis in an alternative embodiment. In an embodiment, the method 900 may continue with coupling the central bearing to the fan chassis at block 925 or, alternatively be coupled to a keyboard chassis. A printed circuit board (PCB) may be coupled to the central bearing at block 930. The PCB may be communicatively coupled to a processor of the information handling system. The method 900 includes physically and electrically coupling an electromagnet to the PCB at block 935. The electric coupling of the electromagnet to the PCB allows for signals from the processor to be sent to the PCB to direct the activation and deactivation of the electromagnet.

The method 900 further includes placing a main shaft into a central bearing receiving cavity formed into the central bearing. The cavity may, in an embodiment, include a bearing that mechanically couples the main shaft to the central bearing while allowing the main shaft to rotate within the cavity of the main shaft. In an alternative embodiment, the central bearing does not include any mechanical coupling of the main shaft to the central bearing and the main shaft is magnetically suspended within the variable height fan. The main shaft is rotationally coupled relative to the central bearing to allow rotation of the first set of fan blades.

The method 900 may continue, at block 945, with coupling a first set of fan blades to the main shaft. The first set of fan blades may include a permanent magnet that magnetically interfaces with the electromagnet to keep the main shaft in the central bearing as well as drive the rotation of the first set of fan blades relative to the central bearing. The method 900 also includes placing a slide shaft into a receiving cavity formed in the main shaft at block 950 and, at block 955, coupling a second set of fan blades to the slide shaft. In an embodiment, the slide shaft may be coupled to the main shaft via a spline that causes the main shaft to rotate concurrently with the slide shaft and the first set of fan blades to rotate about the bearing along with the second set of fan blades.

The method 900 may also include placing a biasing member between the main shaft and the slide shaft at block 960. The placement of the biasing member in the receiving cavity of the main shaft operatively couples the biasing member between the main shaft and slide shaft to bias the slide shaft away from the main shaft. As described herein, the biasing member may extend the height of the variable height fan so that the maximum height is achieved. In some embodiments, the method 900 may include adding a processor, a memory, a power source, a bus, a heat sink, a heat pipe, and a heat manifold and vapor chamber within the C-cover or within a D-cover that will be operatively coupled to the C-cover at block 965. As described herein, the processor, memory may be operatively coupled via a bus. The processor may also be operatively coupled to the PCB, fan module, the power management unit, and power source. In an embodiment, each of these may be operatively coupled to each other via the bus.

The processor, either CPU or GPU, may be thermally coupled to a heat sink, vapor chamber, or other heat mitigation structure in order to draw an amount of heat from the processor. Other heat sinks may also be included within the base chassis of the information handling system such that the airflow produced by the variable height fan carries away the heat from the heat sinks. The other cooling systems such as the heat pipe and the heat manifold and vapor chamber may also be included within the base chassis and coupled to the C-cover or D-cover in order to interact with the airflow produced by the variable height fan throughout the information handling system.

The method 900 includes, at block 970, coupling a D-cover to the C-cover to house the fan chassis between the C-cover and D-cover. In this embodiment, the D-cover may include a contact point prominence that is formed into the D-cover or a bottom fan chassis on the D-cover that is operatively coupled to the slide shaft as described herein. In an embodiment, the contact point prominence may maintain the slide shaft within the receiving cavity formed in the main shaft which allows for rotation of the same.

The blocks of the flow diagrams of FIG. 9 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
a processor, a memory, and a power source;
a base chassis including an outer cover surface;
a variable height fan including:
a main shaft including a cavity formed centrally within the main shaft;
a first set of fan blades operatively coupled to the main shaft;
a slide shaft placed within the cavity of the main shaft where the slide shaft is operatively coupled to the main shaft to rotate with the main shaft;
a second set of fan blades operatively coupled to the slide shaft;
a biasing member to bias the slide shaft to extend out of the main shaft; and
a contact point prominence as a rotational point interface with the slide shaft operatively coupled to the outer cover surface.

2. The information handling system of claim 1, wherein the second set of fan blades are placed to fit between the first set of fan blades.

3. The information handling system of claim 1, wherein the contact point prominence interfaces mechanically with the slide shaft to cause the slide shaft to slide into the cavity when an outer cover is deformed.

4. The information handling system of claim 1, wherein the second set of fan blades are slidably coupled to the first set of fan blades.

5. The information handling system of claim 1, wherein the slide shaft further comprises a spline that mates with a groove formed within the cavity formed in the main shaft.

6. The information handling system of claim 1, further comprising:
a first set of magnets;
a set of electromagnets coupled to a non-rotating printed circuit board of the variable height fan to magnetically drive the first set of magnets; and
a fan module controlling activation of the electromagnets to drive the first set of blades.

7. The information handling system of claim 1, further comprising a bearing mechanically coupled to a housing of the variable height fan wherein the bearing allows the main shaft to rotate within a bearing cavity formed therein.

8. A variable height fan for use as a blower in an information handling system, comprising:
a housing to house the fan;
a printed circuit board (PCB) mechanically coupled to the housing;
a power source electrically coupled to the PCB;
and an electromagnet electrically coupled to the PCB and power source;
a bearing mechanically coupled to the housing, the bearing including a first cavity formed therein; and
a main shaft placed within the first cavity, the main shaft including a second cavity formed centrally within the main shaft;
a first set of fan blades mechanically coupled to the main shaft, the first set of fan blades comprising a set of magnets to magnetically couple with and driven by the electromagnet;
a slide shaft coupled within the second cavity of the main shaft;
a second set of fan blades that are
mechanically coupled to the slide shaft, where
each blade of the second set of fan blades are mechanically and slidably coupled to one of the fan blades of the first set of fan blades, and
a spring to bias the slide shaft to extend outwardly from the second cavity of the main shaft.

9. The variable height fan of claim 8, further comprising a contact point prominence that interfaces mechanically with the slide shaft to allow the slide shaft to rotate and slide within the second cavity.

10. The variable height fan of claim 8, wherein the slide shaft further comprises a spline that mates with a groove formed within the second cavity formed in the main shaft.

11. The variable height fan of claim 8, further comprising:
an air intake vent to receive air into the variable height fan; and
an outlet air blower aperture.

12. The variable height fan of claim 8, wherein the bearing is press fit into a hole defined in the housing.

13. The variable height fan of claim 8, wherein the housing comprises a top fan chassis and a bottom fan chassis mechanically and slidably coupled to the top fan chassis to allow the bottom fan chassis to move with the second set of fan blades as a force is applied to the bottom fan chassis.

14. The variable height fan of claim 8, wherein the distance between the second set of fan blades and the housing is between 0.4 mm and 0.6 mm.

15. An information handling system, comprising:
a processor, a memory, and a power source housed in a D-cover of a base chassis;
a keyboard chassis configured to have a keyboard mounted thereon and a C-cover configured to house the keyboard chassis in the base chassis;
a fan chassis mechanically coupled to the keyboard chassis;
a central bearing coupled to the fan chassis, the central bearing supporting:
a printed circuit board and an electromagnet physically and electrically coupled to the printed circuit board to drive the rotation of a variable height fan;
the variable height fan comprising:
a main shaft including a cavity formed centrally within the main shaft;

a first set of fan blades mechanically coupled to the main shaft;
a slide shaft slidingly coupled within the cavity of the main shaft;
a second set of fan blades mechanically coupled to the slide shaft;
a biasing member to bias the slide shaft to extend outwardly from the cavity of the main shaft; and
the D-cover configured to house the fan chassis within the base chassis, the D-cover comprising an exhaust vent to allow air flowing through the variable height fan to exit the base chassis.

16. The information handling system of claim 15, further comprising a contact point prominence formed in the fan chassis to interface with the D-cover and the slide shaft to selectively compress the height of the variable height fan when force is applied to the number of vents of the D-cover while allowing rotation of the slide shaft.

17. The information handling system of claim 15, wherein the second set of fan blades are placed to fit between the first set of fan blades.

18. The information handling system of claim 15, wherein the second set of fan blades are slidably coupled to the first set of fan blades to limit rotational separation or vertical separation of the first set of fan blades relative to the second set of fan blades.

19. The information handling system of claim 15, wherein the slide shaft further comprises a spline that mates with a groove formed within the cavity formed in the main shaft.

20. The information handling system of claim 15, wherein the distance between the second set of fan blades and the fan chassis is between 0.4 mm and 0.6 mm.

\* \* \* \* \*